United States Patent
Fuji

(10) Patent No.: US 12,080,675 B2
(45) Date of Patent: Sep. 3, 2024

(54) SEMICONDUCTOR DEVICE AND BONDING METHOD

(71) Applicant: ROHM CO., LTD., Kyoto (JP)

(72) Inventor: Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 483 days.

(21) Appl. No.: 17/430,691

(22) PCT Filed: Feb. 10, 2020

(86) PCT No.: PCT/JP2020/005079
§ 371 (c)(1),
(2) Date: Aug. 12, 2021

(87) PCT Pub. No.: WO2020/179369
PCT Pub. Date: Sep. 10, 2020

(65) Prior Publication Data
US 2022/0199566 A1    Jun. 23, 2022

(30) Foreign Application Priority Data
Mar. 5, 2019    (JP) .................... 2019-039352

(51) Int. Cl.
*H01L 23/00*    (2006.01)
*H01L 23/12*    (2006.01)
(Continued)

(52) U.S. Cl.
CPC .............. *H01L 24/40* (2013.01); *H01L 23/12* (2013.01); *H01L 23/3107* (2013.01);
(Continued)

(58) Field of Classification Search
CPC ..... H01L 24/40; H01L 23/12; H01L 23/3107; H01L 23/49562; H01L 24/32;
(Continued)

(56) References Cited

U.S. PATENT DOCUMENTS

2004/0240767 A1* 12/2004 Kimura ................ G02B 6/4218
385/11
2012/0181682 A1* 7/2012 Soyano ................... H01L 23/04
257/E23.06
(Continued)

FOREIGN PATENT DOCUMENTS

JP    2002-316282 A    10/2002
JP    2006-310609 A    11/2006
(Continued)

OTHER PUBLICATIONS

Office Action received in the corresponding Japanese Patent application, May 2, 2023, and English translation (6 pages).
(Continued)

*Primary Examiner* — Robert G Bachner
(74) *Attorney, Agent, or Firm* — HSML P.C.

(57) ABSTRACT

Semiconductor device A1 of the disclosure includes: semiconductor element 11 having element obverse surface 11a and element reverse surface 11b spaced apart from each other in z direction (first direction) with first region 111 formed on the element obverse surface 11a; metal plate 31 (electrode member) disposed on the element obverse surface 11a and electrically connected to the first region 111; electrically conductive substrate 22A (first conductive member) disposed to face the element reverse surface 11b and bonded to the semiconductor element 11; electrically conductive substrate 22B (second conductive member) spaced apart from the conductive substrate 22A (first conductive member); and lead member 5 (connecting member) electrically connecting the metal plate 31 (electrode member) and the conductive substrate 22B (second conductive member). The lead member 5 (connecting member) is bonded to the metal plate 31 (electrode member) by laser welding. The semi-
(Continued)

conductor device of this configuration provides improved reliability.

23 Claims, 21 Drawing Sheets

(51) Int. Cl.
   *H01L 23/31* (2006.01)
   *H01L 23/495* (2006.01)
(52) U.S. Cl.
   CPC ........ *H01L 23/49562* (2013.01); *H01L 24/32* (2013.01); *H01L 24/37* (2013.01); *H01L 24/84* (2013.01); *H01L 2224/32225* (2013.01); *H01L 2224/37147* (2013.01); *H01L 2224/40245* (2013.01); *H01L 2224/84893* (2013.01)
(58) Field of Classification Search
   CPC .................. H01L 24/37; H01L 24/84; H01L 2224/32225; H01L 2224/37147; H01L 2224/40245; H01L 2224/84893; H01L 24/45; H01L 24/73; H01L 2224/45147; H01L 23/3142; H01L 23/315; H01L 23/3735; H01L 23/49568; H01L 24/06; H01L 24/48; H01L 24/49; H01L 2224/04026; H01L 2224/04034; H01L 2224/04042; H01L 23/49524; H01L 23/49575; H01L 23/49811; H01L 25/072; H01L 2224/0603; H01L 2224/40; H01L 2224/40225; H01L 2224/45124; H01L 2224/45144; H01L 2224/48091; H01L 2224/48247; H01L 2224/48472; H01L 2224/49113; H01L 2224/49433; H01L 2224/73221; H01L 2224/73265; H01L 2224/84214; H01L 2924/181; H01L 2924/19107; B23K 26/0622; B23K 26/22; B23K 26/32; B23K 2101/36; B23K 2103/12
   See application file for complete search history.

(56) References Cited

U.S. PATENT DOCUMENTS

| | | | | |
|---|---|---|---|---|
| 2016/0343641 | A1* | 11/2016 | Hori | H01L 25/072 |
| 2017/0368638 | A1* | 12/2017 | Tayebati | B23K 26/0626 |
| 2018/0006171 | A1* | 1/2018 | Moors | H01L 31/1864 |

FOREIGN PATENT DOCUMENTS

| | | |
|---|---|---|
| JP | 2008-212977 A | 9/2008 |
| JP | 2008-305902 A | 12/2008 |
| JP | 2009-105266 A | 5/2009 |
| JP | 2009-105267 A | 5/2009 |
| JP | 2015-149326 A | 8/2015 |

OTHER PUBLICATIONS

Office Action received in the corresponding Chinese Patent application, Jun. 8, 2023, and machine translation (14 pages).
International Search Report issued in PCT/JP2020/005079, Apr. 21, 2020 (3 pages).
Office Action received in the corresponding Chinese Patent application, Jan. 9, 2024, and machine translation (8 pages).

* cited by examiner

SEMICONDUCTOR DEVICE AND BONDING METHOD

TECHNICAL FIELD

The present disclosure relates to semiconductor devices and bonding methods.

BACKGROUND ART

Semiconductor devices of various configurations have been proposed. Patent Document 1 discloses a conventional semiconductor device. This semiconductor device includes a semiconductor element, a leadframe and a strap (an electrically conductive metal plate). The semiconductor element is mounted on a portion of the leadframe and includes a source electrode. The strap is joined to the source electrode of the semiconductor element by ultrasonic bonding.

PRIOR ART DOCUMENT

[Patent Document 1] JP-A-2006-310609

SUMMARY OF THE INVENTION

Problem to be Solved by the Invention

According to the semiconductor device of Patent Document 1, the strap is joined to the source electrode of the semiconductor element by ultrasonic welding to ensure electrical connection between the strap and the source electrode. The ultrasonic bonding involves pressing the strap against the source electrode and applying ultrasonic vibrations. The pressure and vibration applied during this process may cause damage to the semiconductor element, which may decrease the reliability of the resulting semiconductor device.

The present disclosure has been conceived in view of the issues noted above and aims to provide a semiconductor device and a bonding method that help to improve reliability.

Means to Solve the Problem

A first aspect of the present disclosure provides a semiconductor device including: a semiconductor element having an element obverse surface and an element reverse surface spaced apart from each other in a first direction and a first region formed on the element obverse surface; an electrode member disposed on the element obverse surface and electrically connected to the first region; a first conductive member disposed to face the element reverse surface and bonded to the semiconductor element; a second conductive member spaced apart from the first conductive member; and a connecting member electrically connecting the electrode member and the second conductive member. The connecting member is bonded to the electrode member by laser welding.

A second aspect of the present disclosure provides a method for bonding an electrically conductive connecting member to a semiconductor element having an element obverse surface and an element reverse surface spaced apart from each other in a first direction. The semiconductor element includes a first region formed on the element obverse surface. The method includes: a first step of placing an electrically conductive member on the element obverse surface to electrically connect the electrically conductive member to the first region; and a second step of placing the connecting member on the electrically conductive member and bonding the connecting member to the electrically conductive member by laser welding at a region where the connecting member and the electrically conductive member overlap as viewed in the first direction. In the laser welding, use is made of a first laser beam and a second laser beam having mutually different wavelengths.

Advantages of Invention

A semiconductor device and a bonding method according to the present disclosure can improve reliability.

MODE FOR CARRYING OUT THE INVENTION

Figure 1:
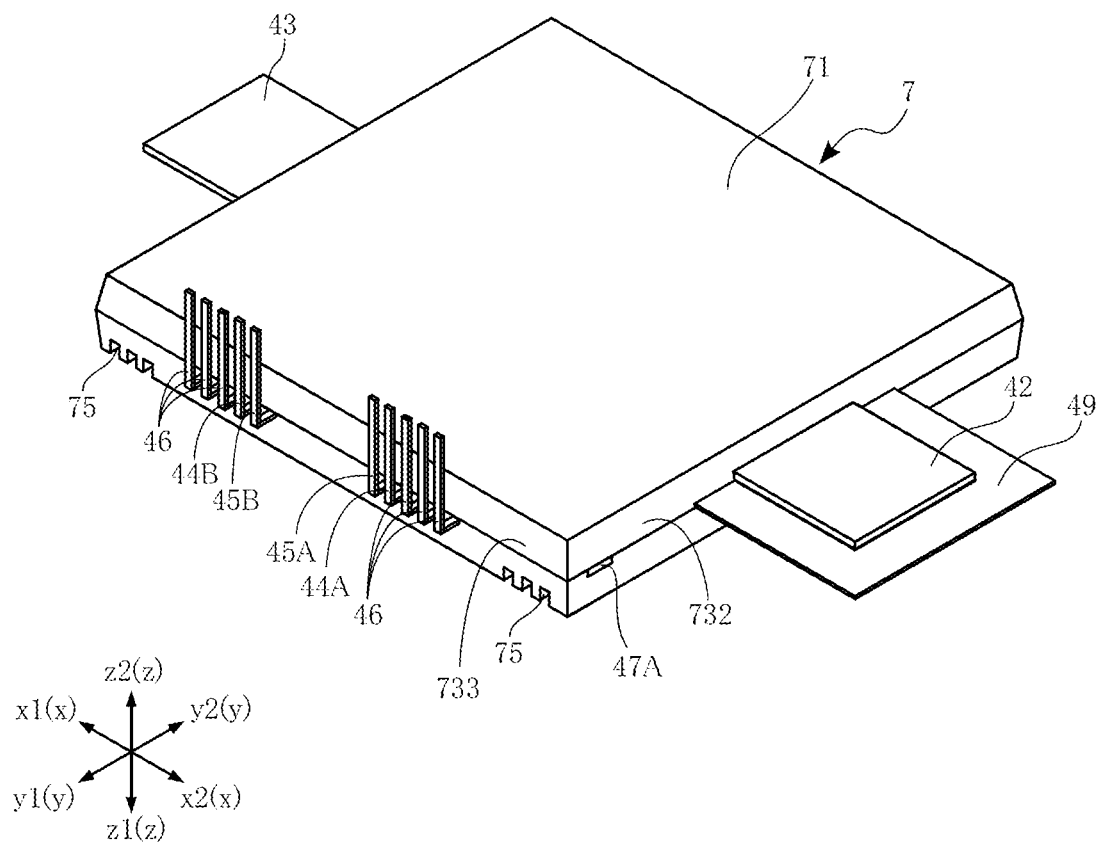
FIG. 1 is a perspective view of a semiconductor device according to a first embodiment.

With reference to the drawings, semiconductor devices and bonding methods according to the present disclosure will be described.

FIGS. 1 to 12 show a semiconductor device according to a first embodiment of the present disclosure. The semiconductor device A1 of the first embodiment includes a plurality of semiconductor chips 10, a support substrate 20, a plurality of metal plates 31, a plurality of terminals 40, an insulating plate 49, a plurality of lead members 5, a plurality of wires 6 and a plurality of resin members 7. The plurality of terminals 40 include input terminals 41 and 42, an output terminal 43, a pair of gate terminals 44A and 44B, a pair of sensor terminals 45A and 45B, a plurality of dummy terminals 46, and a pair of side terminals 47A and 47B.

Figure 2:
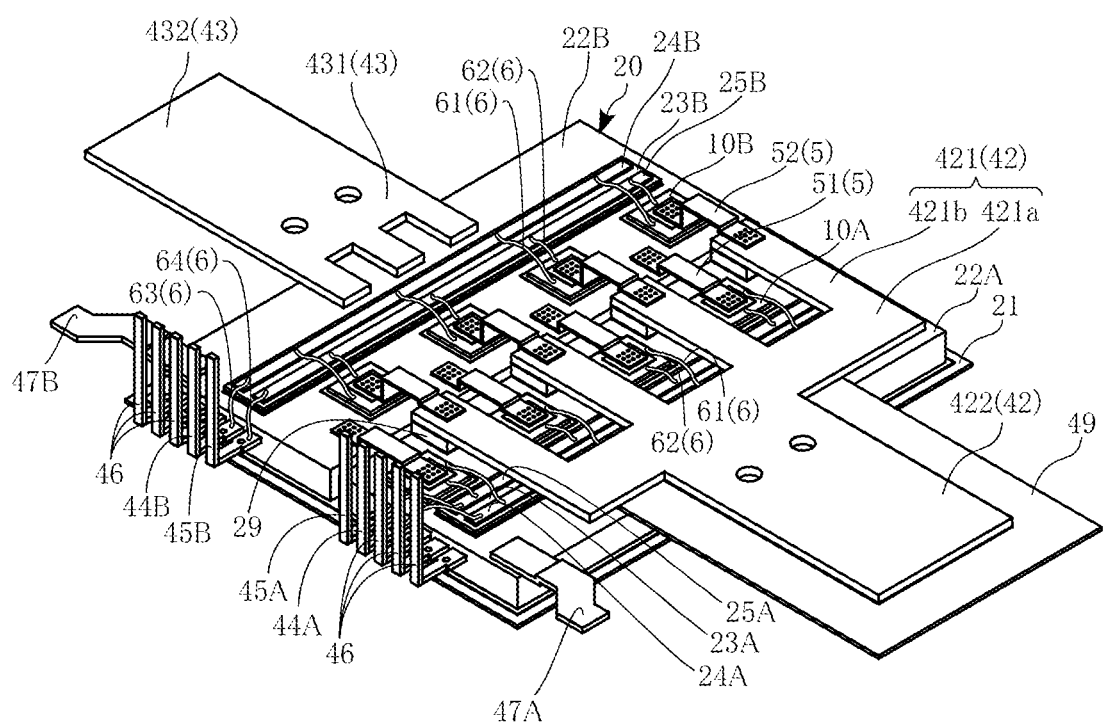
FIG. 2 is a perspective view similar to FIG. 1 but omitting the resin member.
Figure 2:
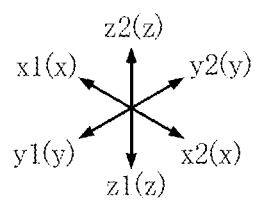
Figure 3:
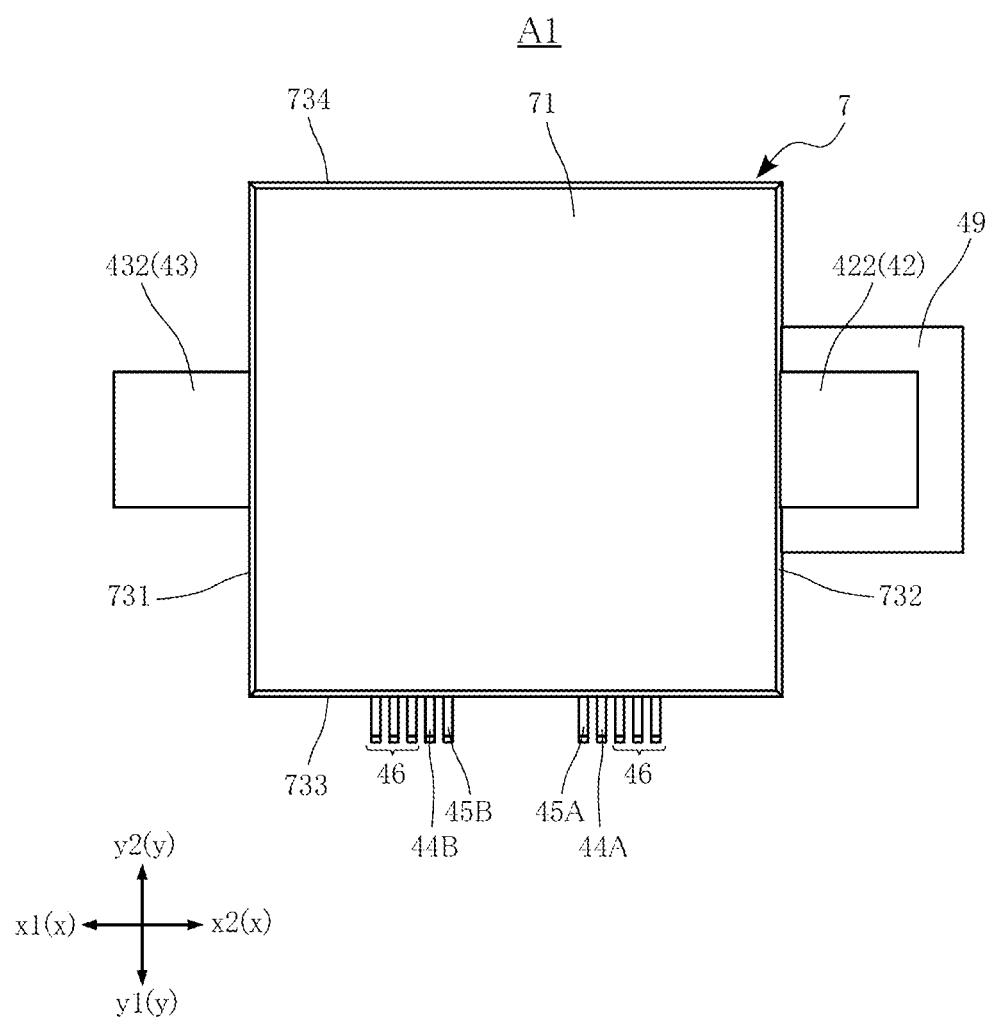
FIG. 3 is a plan view of the semiconductor device according to the first embodiment.
Figure 4:
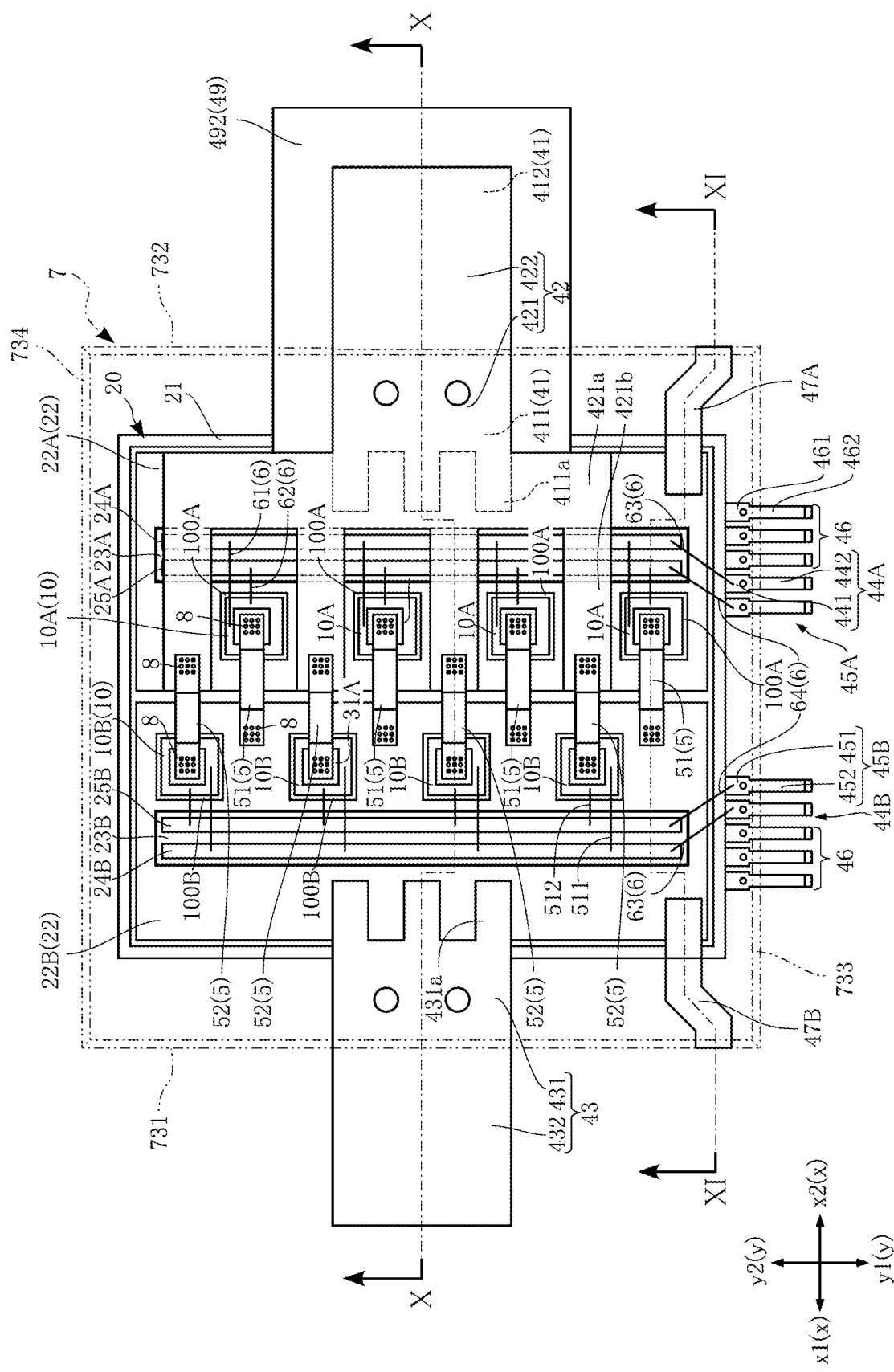
FIG. 4 is a plan view similar to FIG. 3, with the resin member shown in phantom.
Figure 5:
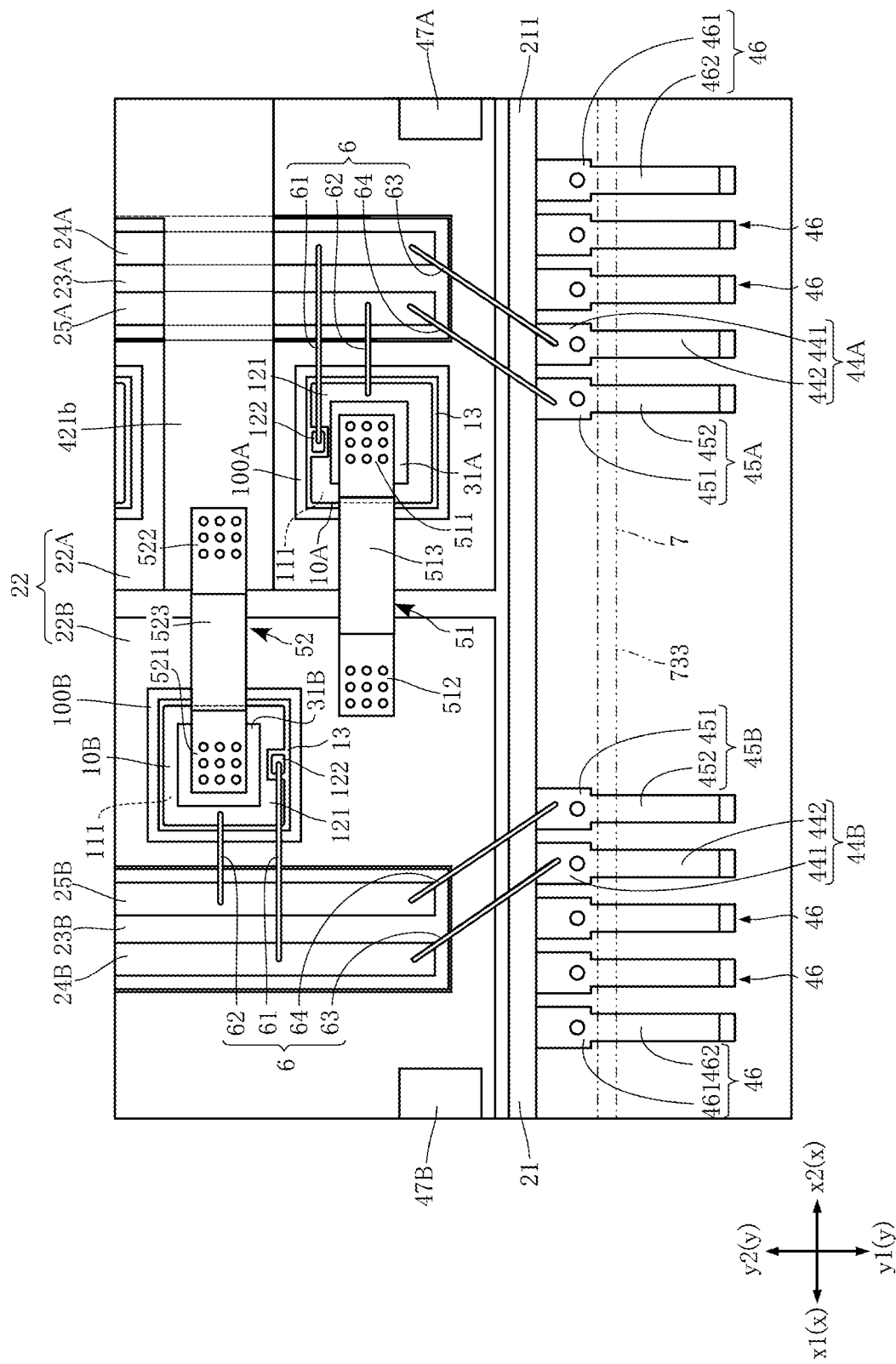
FIG. 5 is an enlarged view of a portion of FIG. 3.
Figure 6:
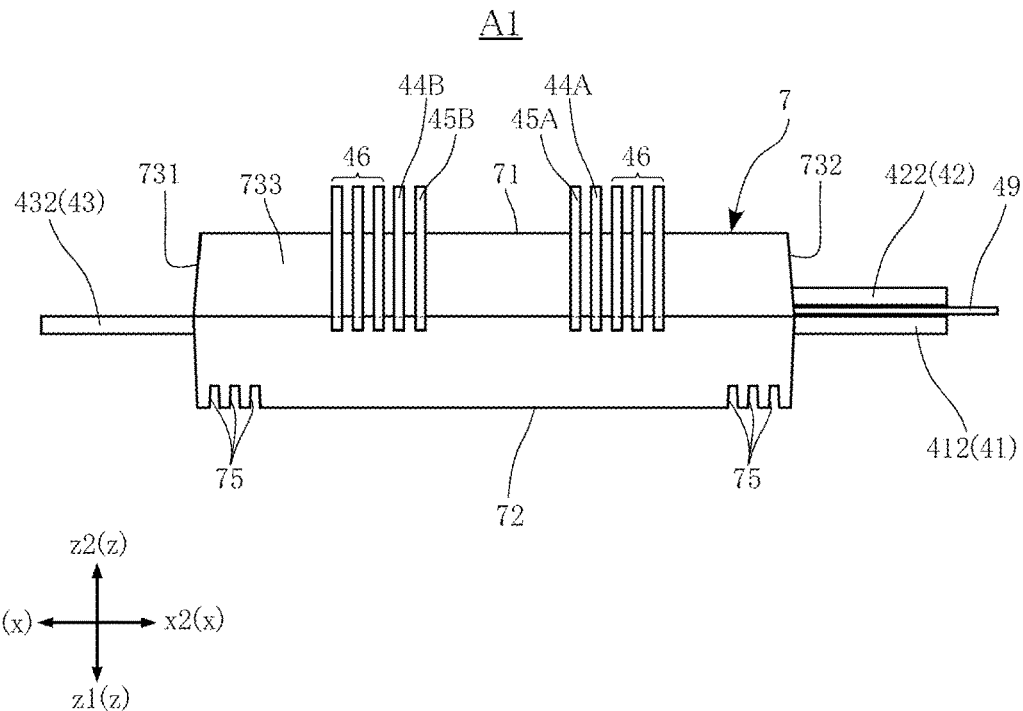
FIG. 6 is a front view of the semiconductor device according to the first embodiment.
Figure 7:
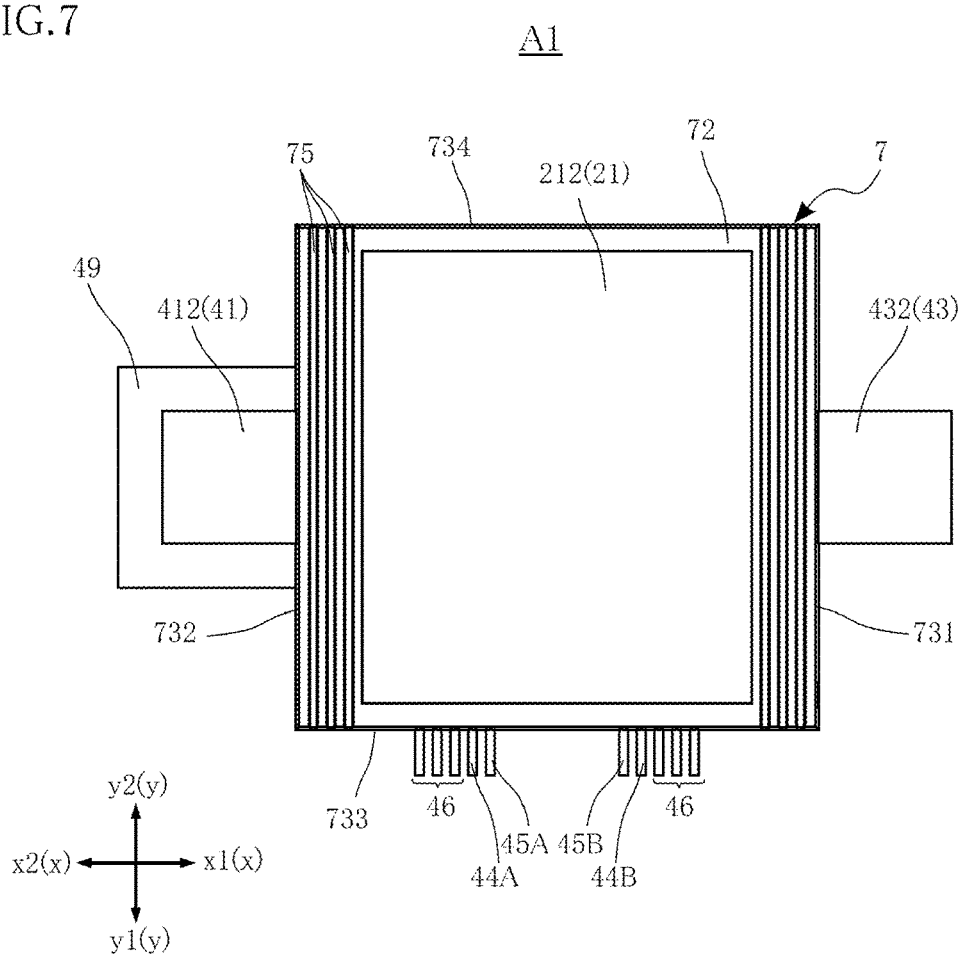
FIG. 7 is a bottom view of the semiconductor device according to the first embodiment.
Figure 8:
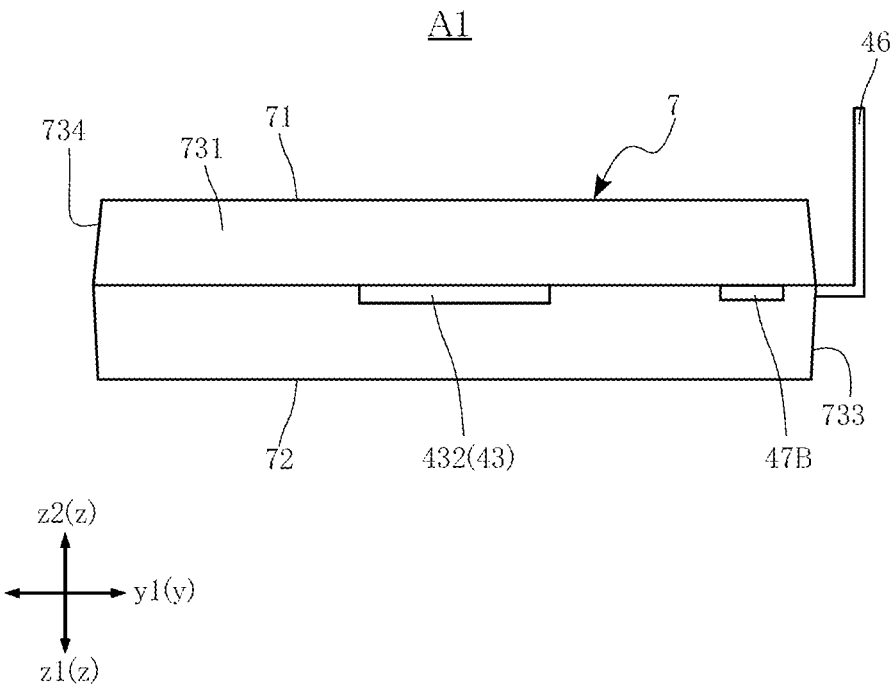
FIG. 8 is a side view (left side) of the semiconductor device according to the first embodiment.
Figure 9:
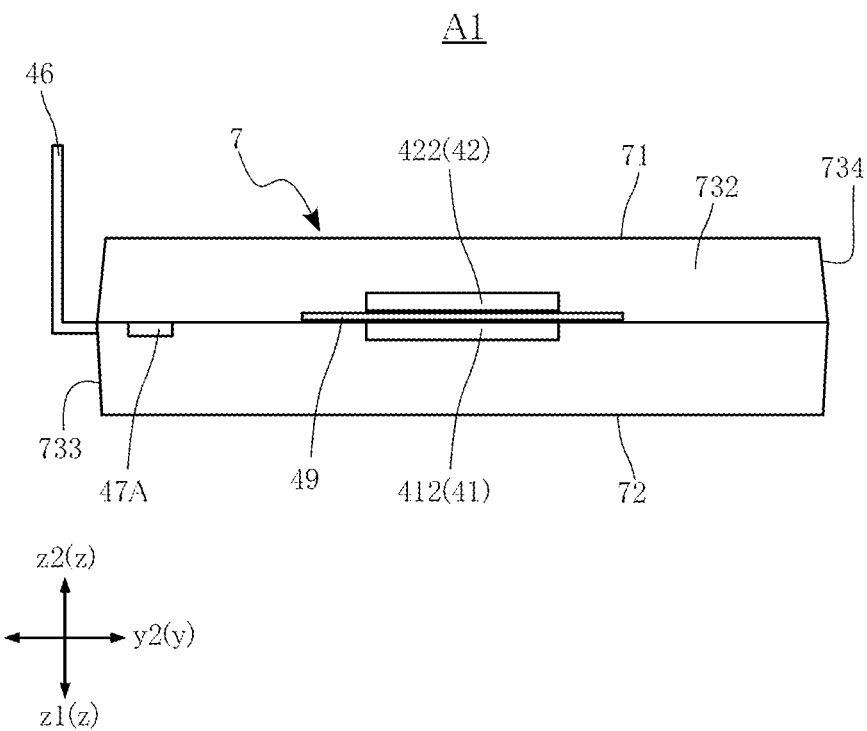
FIG. 9 is a side view (right side) of the semiconductor device according to the first embodiment.
Figure 10:
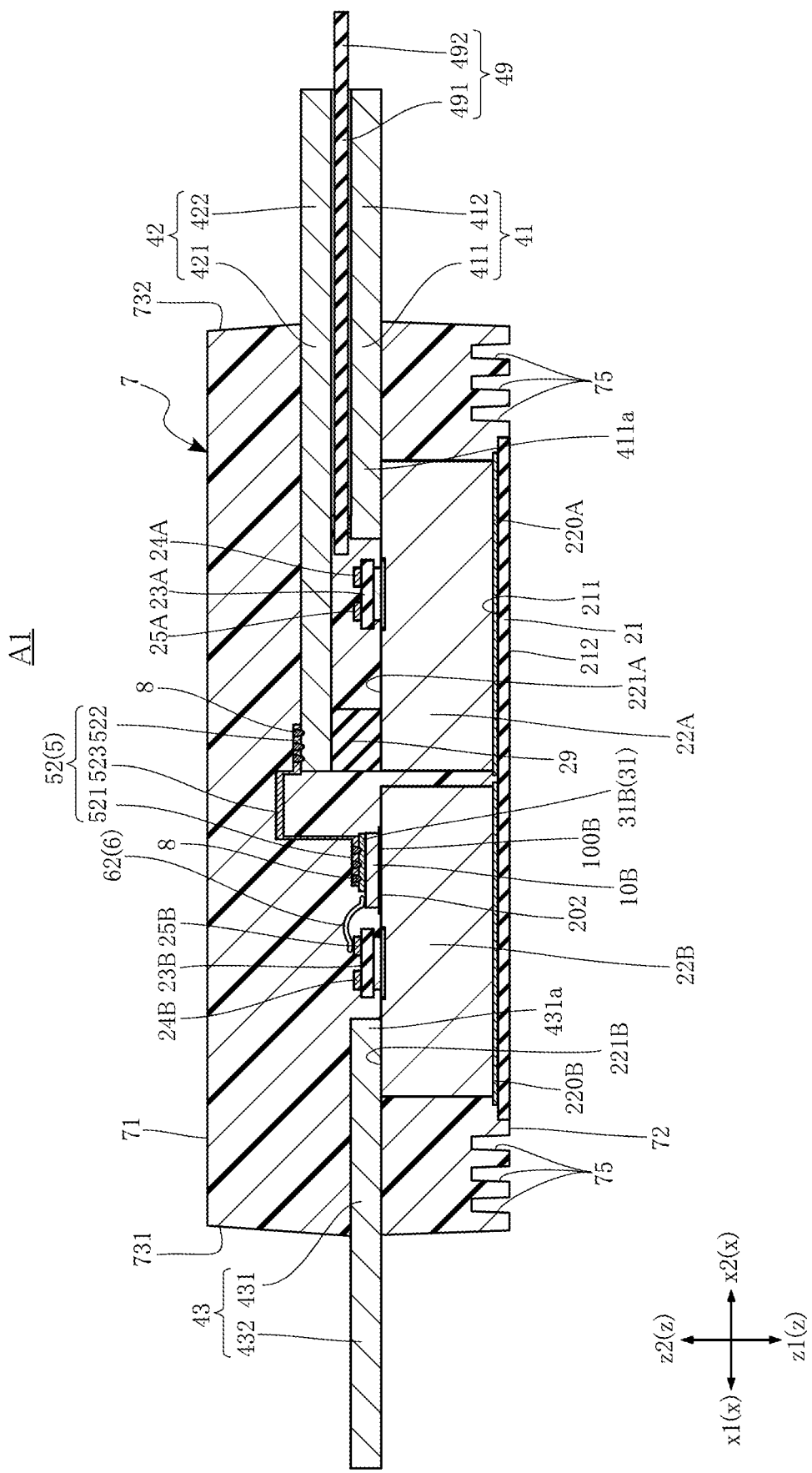
FIG. 10 is a sectional view taken along line X-X of FIG. 4.
Figure 11:
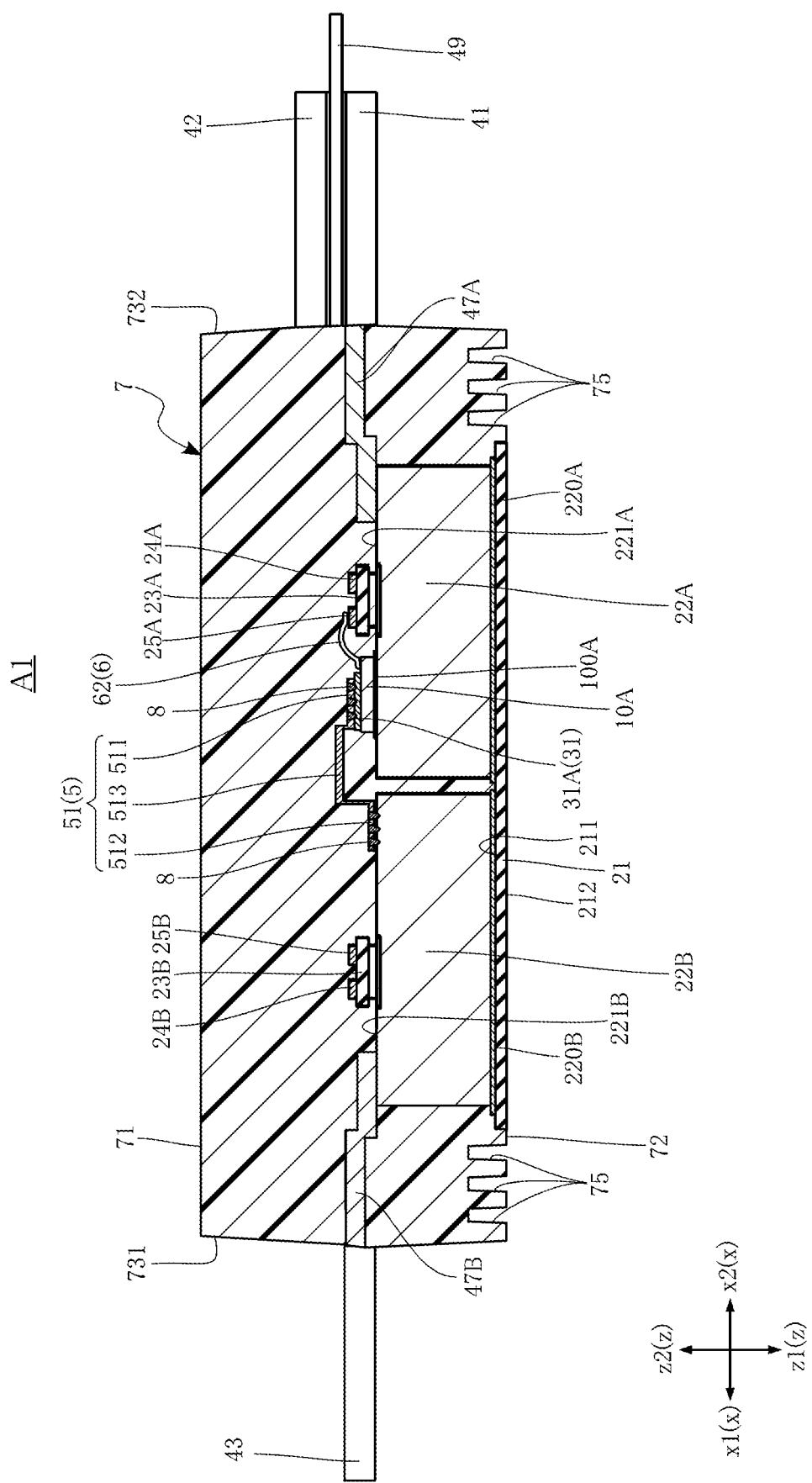
FIG. 11 is a sectional view taken along line XI-XI of FIG. 4.
Figure 12:
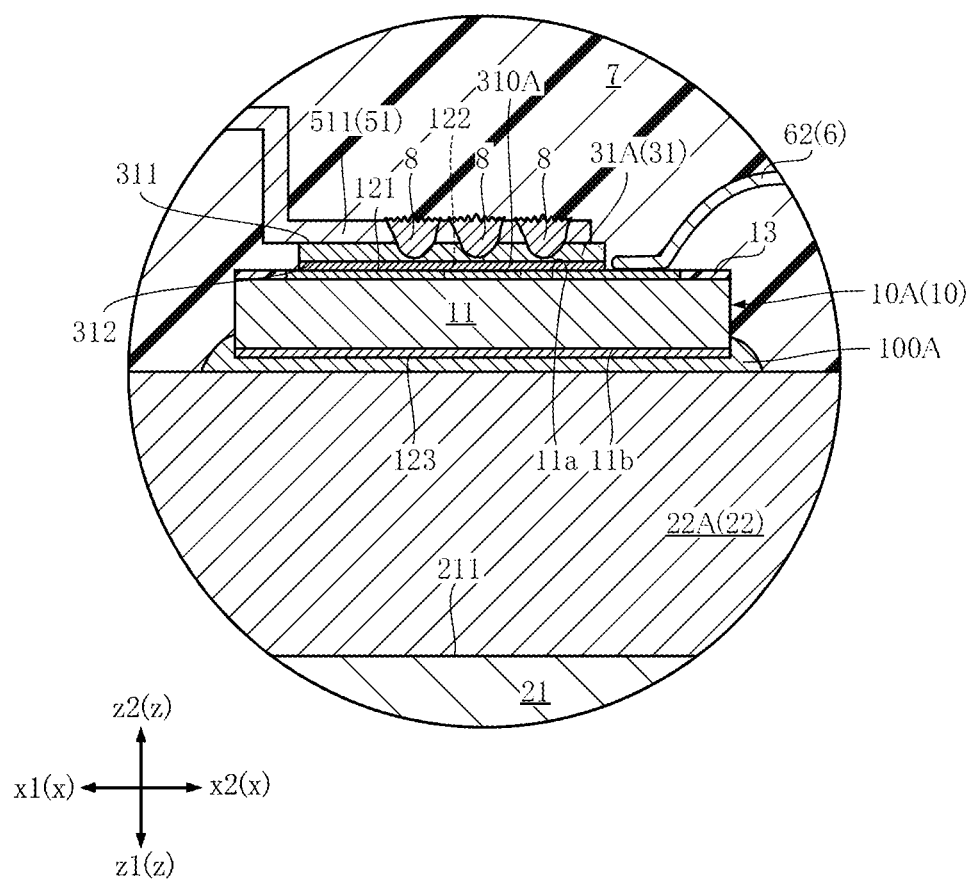
FIG. 12 is an enlarged view of a portion of FIG. 11.

FIG. 1 is a perspective view of the semiconductor device A1. FIG. 2 is a perspective view similar to FIG. 1 but omitting the resin member 7. FIG. 3 is a plan view of the semiconductor device A1. FIG. 4 is a plan view similar to FIG. 3, with the resin member 7 shown in phantom (in two-dot chain line). FIG. 5 shows a portion of FIG. 4 on an enlarged scale. FIG. 6 is a front view of the semiconductor device A1. FIG. 7 is a bottom view of the semiconductor device A1. FIG. 8 is a side view (left side) of the semiconductor device A1. FIG. 9 is a side view (right side) of the semiconductor device A1. FIG. 10 is a sectional view taken along line X-X of FIG. 4. FIG. 11 is a sectional view taken along line XI-XI of FIG. 4. FIG. 12 shows a portion of FIG. 11 on an enlarged scale.

For convenience, FIGS. 1 to 12 define three directions perpendicular to each other as x, y and z directions. More specifically, the x direction corresponds to the horizontal direction as seen in plan view of the semiconductor device A1 (see FIGS. 3 and 4). The y direction corresponds to the vertical direction as seen in plan view of the semiconductor device A1 (see FIGS. 3 and 4). The z direction corresponds to the thickness direction of the semiconductor device A1. In addition, one side in the x direction is defined as x1 direction, and the other side as x2 direction. One side in the in the y direction is defined as y1 direction, and the other side as y2 direction. One side in the in the z direction is defined as z1 direction, and the other side as z2 direction. The z1 direction may be referred to as the downward direction, and the z2 direction as the upward direction. A dimension in the z direction may be referred to as a thickness. The z direction corresponds to the "first direction" recited in the claims.

The semiconductor chips 10 form the functional core of the semiconductor device A1. The semiconductor chips 10 are rectangular as seen in the z direction (or "in plan view"). This plan-view shape of the semiconductor chips 10 is merely an example. Each semiconductor chip 10 includes a semiconductor element 11, a plurality of element electrodes 12 and an insulating film 13.

The semiconductor element 11 is made of a semiconductor material, which mainly is silicon carbide (SiC). The semiconductor material is not limited to SiC, and may be silicon (Si), gallium arsenide (GaAs) or gallium nitride (GaN). The present disclosure is directed to an example in which the semiconductor elements 11 are metal-oxide-semiconductor field-effect transistors (MOSFETs). Instead of MOSFETs, the semiconductor elements 11 may be field effect transistors such as metal-insulator-semiconductor FETs (MISFETs), bipolar transistors such as insulated gate bipolar transistors (IGBTs), IC chips such as LSIs, diodes or capacitors. In one example, the semiconductor elements 11 may be identical n-channel MOSFETs. Alternatively, the semiconductor elements 11 may be p-channel MOSFETs. The semiconductor elements 11 may be about 50 to 370 μm in thickness, for example.

Each semiconductor element 11 has an element obverse surface 11a and an element reverse surface 11b. The element obverse surface 11a and the element reverse surface 11b of the semiconductor element 11 are spaced apart in the z direction. The element obverse surface 11a is an upper surface of the semiconductor element 11 and faces in the z2 direction. The element reverse surface 11b is a lower surface of the semiconductor element 11 and faces in the z1 direction.

Each semiconductor element 11 includes a first region 111, a second region 112 and a third region 113. Each of the first region 111 and the second region 112 is a region made of a semiconductor material within the semiconductor element 11 on (or adjacent to) the element obverse surface 11a. The third region 113 is a region made of a semiconductor material on the element reverse surface 11b. In the example in which the semiconductor element 11 is a MOSFET, the first region 111 is a source region, the second region 112 is a gate region, and the third region 113 is a drain region. Alternatively, the first region 111 may be a drain region, and the third region 113 may be a source region. In addition, the third region 113 may be located on the element obverse surface 11a.

The element electrodes 12 are electrode pads of the semiconductor chips 10 and used as the terminals of the semiconductor chips 10. The element electrodes 12 of each semiconductor chip 10 include a first electrode layer 121, a second electrode layer 122 and a third electrode layer 123.

The first electrode layer 121 is exposed on the element obverse surface 11a of the semiconductor element 11. The first electrode layer 121 forms an ohmic contact to the first region 111. The first electrode layer 121 is used as a source electrode of the semiconductor chip 10 for passing a source current. The first electrode layer 121 may be divided into a plurality of segments.

The second electrode layer 122 is exposed on the element obverse surface 11a of the semiconductor element 11. The second electrode layer 122 forms an ohmic contact to the second region 112. The second electrode layer 122 is used as a gate electrode of the semiconductor chip 10 to apply a gate voltage for driving the semiconductor element 11.

In plan view, the first electrode layer 121 is larger than the second electrode layer 122. The first electrode layer 121 and the second electrode layer 122 overlap with each other as viewed in the x direction and also in the y direction.

The third electrode layer 123 is exposed on the element reverse surface 11b of the semiconductor element 11. The third electrode layer 123 forms an ohmic contact to the third region 113. The third electrode layer 123 covers the entire surface of the element reverse surface 11b. The third electrode layer 123 is used as a drain electrode of the semiconductor chip 10 for passing a drain current.

As shown in FIGS. 5 and 12, the insulating film 13 of each semiconductor chip 10 is formed on the element obverse surface 11a. The insulating film 13 is electrically insulative. The insulating film 13 is interposed between the first electrode layer 121 and the second electrode layer 122 to electrically isolate the two electrode layers. In an example in which the first electrode layer 121 is divided into a plurality of separate segments, the insulating film 13 is also present between these segments to electrically isolate the segments. The insulating film 13 may be a multilayer film including a silicon dioxide ($SiO_2$) layer, a silicon nitride ($SiN_4$) layer and a polybenzoxazole layer stacked in the stated order from the element obverse surface 11a. In another example, a polyimide layer may be included instead of the polybenzoxazole layer.

The plurality of semiconductor chips 10 include a plurality of semiconductor chips 10A and a plurality of semiconductor chips 10B. The semiconductor device A1 is configured as a half-bridge switching circuit, and the semiconductor chips 10A form an upper arm circuit of the switching circuit and the semiconductor chips 10B form a lower arm circuit. In FIGS. 2 and 4, the semiconductor device A1 includes four semiconductor chips 10A and four semiconductor chips 10B. The number of the semiconductor chips is not limited to the illustrated example and may be appropriately determined according to the functions required for the semiconductor device A1.

As shown in FIGS. 2, 4, 5, 11 and 12, the semiconductor chips 10A are mounted on the support substrate 20 (a conductive substrate 22A, which will be described later). The semiconductor chips 10A are arrayed in the y direction at spaced intervals. Each semiconductor chip 10A is disposed on the conductive substrate 22A with the element reverse surface 11b facing the conductive substrate 22A. As shown in FIGS. 11 and 12, the semiconductor chip 10A is bonded to the support substrate 20 (the conductive substrate 22A) via an electrically conductive bonding material 100A. Consequently, the third electrode layer 123 of the semiconductor chip 10A is electrically connected to the support substrate 20 (the conductive substrate 22A) via the conductive bonding material 100A. The conductive bonding material 100A may be made of a sintered metal, such as Ag or Cu. The material of the conductive bonding material 100A is not limited to a sintered metal, and it may be Ag paste or solder instead.

As shown in FIGS. 2, 4, 5 and 10, the semiconductor chips 10B are mounted on the support substrate 20 (a conductive substrate 22B, which will be described later). The semiconductor chips 10B are arrayed in the y direction at spaced intervals. Each semiconductor chip 10B is disposed on the conductive substrate 22A with the element reverse surface 11b facing the conductive substrate 22B. As shown in FIG. 10, the semiconductor chip 10B is bonded to the support substrate 20 (the conductive substrate 22B) via an electrically conductive bonding material 100B. Consequently, the third electrode layer 123 of the semiconductor chip 10B is electrically connected to the support substrate 20 (the conductive substrate 22B) via the conductive bonding material 100B. The conductive bonding material 100B may be made of the same material as the conductive bonding material 100A. The conductive bonding materials 100A and 100B may be collectively referred to as electrically conductive bonding materials 100. As viewed in the x direction, the semiconductor chips 10A are arranged alternately with the semiconductor chips 10B. In another example, each semiconductor chip 10A may be arranged to overlap with a semiconductor chip 10B as viewed in the x direction.

The support substrate 20 is a base supporting the semiconductor chips 10. The support substrate 20 includes an insulating substrate 21, a plurality of electrically conductive substrates 22, a pair of insulating layers 23A and 23B, a pair of gate layers 24A and 24B, a pair of sensor layers 25A and 25B and a plurality of block members 29.

As shown in FIGS. 2, 4 10 and 11, the insulating substrate 21 is a component on which the conductive substrates 22 are placed. The insulating substrate 21 is electrically insulative. In one example, the insulating substrate 21 is made of a ceramic material having a high thermal conductivity. Examples of such ceramic materials include aluminum nitride (AlN), silicon nitride (SiN) and aluminum oxide ($Al_2O_3$). As shown in FIG. 4, the insulating substrate 21 may be rectangular in plan view. The insulating substrate 21 is a single plate that is generally flat. The insulating substrate 21 of this embodiment corresponds to the "insulating member" recited in the claims.

As shown in FIGS. 10 and 11, the insulating substrate 21 has an obverse surface 211 and a reverse surface 212. The obverse surface 211 is spaced apart from the reverse surface 212 in the z direction. The obverse surface 211 faces in the z2 direction, and the reverse surface 212 in the z1 direction. The obverse surface 211 is the side on which the conductive substrates 22 are disposed. The reverse surface 212 is the side on which a non-illustrated heatsink may be connected. The obverse surface 211 is covered by the resin member 7 together with the conductive substrates 22 and the semiconductor chips 10. The reverse surface 212 is exposed from the resin member 7. The configuration of the insulating substrate 21 described above is merely one non-limiting example. In another example, a plurality of insulating substrates 21 may be provided for the respective conductive substrates 22. The obverse surface 211 of this embodiment corresponds to the "insulating-member obverse surface" recited in the claims.

Each conductive substrate 22 is an electrically conductive member having the general shape of a plate. Each conductive substrate 22 is made of copper or a copper alloy. In other words, each conductive substrates 22 is a copper substrate. In another example, each conductive substrate 22 may be a composite substrate made of a graphite substrate having a sheet of copper on both sides graphite substrate in the z direction. The conductive substrate 22 may have a silver plated surface. The conductive substrates 22 and the plurality of terminals 40 together form electrically conduction paths to the semiconductor chips 10. The conductive substrates 22 are spaced apart from each other on the obverse surfaces 211 of the insulating substrates 21.

The conductive substrates 22 include the conductive substrate 22A and the conductive substrate 22B. As shown in FIGS. 2, 4, 10 and 11, the conductive substrates 22A and 22B on the obverse surface 211 of the insulating substrate 21 are adjacent to each other in the x direction with a space in between. As shown in FIG. 4, the conductive substrates 22A and 22B are both rectangular in plan view.

As shown in FIGS. 10 and 11, the conductive substrate 22A is bonded to the obverse surface 211 of the insulating substrate 21 via a bonding material 220A. The bonding material 220A may be made of an electrically conductive material, such as a silver paste, solder or a sintered metal, or even made of an electrically insulative material. As shown in FIGS. 4, 10 and 11, the conductive substrate 22A is located on a side of the conductive substrate 22B in the x2 direction. As shown in FIGS. 10 and 11, the conductive substrate 22A has an observe surface 221A facing in the z2 direction. The semiconductor chips 10A are mounted on the observe surface 221A.

As shown in FIGS. 10 and 11, the conductive substrate 22B is bonded to the obverse surface 211 of the insulating substrate 21 by a bonding material 220B. The bonding material 220B may be made of an electrically conductive material, such as a silver paste, solder or a sintered metal, or even made of an electrically insulative material. As shown in FIGS. 10 and 11, the conductive substrate 22B has an observe surface 221B facing in the z2 direction. The semiconductor chips 10B are mounted on the observe surface 221B. In addition, a plurality of lead members 5 (first leads 51 described later) are bonded at one end to the observe surface 221B.

The pair of insulating layers 23A and 23B are electrically insulating and may be made of a grass epoxy resin, for example. As shown in FIGS. 2 and 4, the insulating layers 23A and 23B have a band shape elongated in the y direction. As shown in FIGS. 10 and 11, the insulating layer 23A is bonded to the observe surface 221A of the conductive substrate 22A. The insulating layer 23A is located on a side of the semiconductor chips 10A in the x2 direction. As shown in FIGS. 10 and 11, the insulating layer 23B is bonded to the observe surface 221B of the conductive substrate 22B. The insulating layer 23B is located on a side of the semiconductor chips 10B in the x1 direction.

The gate layers 24A and 24B are electrically conductive and may be made of copper or a copper alloy, for example. As shown in FIGS. 2 and 4, the gate layers 24A and 24B have a band shape elongated in the y direction. As shown in FIGS. 10 and 11, the gate layer 24A is disposed on the insulating layer 23A. The gate layer 24A is electrically connected to the second electrode layers 122 (the gate electrodes) of the semiconductor chips 10A via wires 6 (gate wires 61 described later). As shown in FIGS. 10 and 11, the gate layer 24B is disposed on the insulating layer 23B. The gate layer 24B is electrically connected to the second electrode layers 122 (gate electrodes) of the semiconductor chips 10B via wires 6 (gate wires 61 described later).

The sensor layers 25A and 25B are electrically conductive and may be made of copper or a copper alloy, for example. As shown in FIGS. 2 and 4, the sensor layers 25A and 25B have a band shape elongated in the y direction. As shown in FIGS. 10 and 11, the sensor layer 25A is disposed on the insulating layer 23A along with the gate layer 24A. In plan view, the sensor layer 25A is located on the insulating layer 23A alongside the gate layer 24A in spaced relation with the gate layer 24A. In the x direction, the sensor layer 25A is located closer to the semiconductor chips 10A than the gate layer 24A is. That is, the sensor layer 25A is located on a side of the gate layer 24A in the x1 direction. In another example, the positional relation may be opposite between the gate layer 24A and the sensor layer 25A in the x direction. The sensor layer 25A is electrically connected to the first electrode layers 121 (source electrode) of the semiconductor chips 10A via wires 6 (sensor wires 62 described later). As shown in FIGS. 10 and 11, the sensor layer 25B is located on the insulating layer 23B along with the gate layer 24B. In plan view, the sensor layer 25B is located on the insulating layer 23B alongside the gate layer 24B in spaced relation with the gate layer 24B. In the x direction, the sensor layer 25B is located closer to the semiconductor chips 10B than the gate layer 24A is. That is, the sensor layer 25B is located on a side of the gate layer 24B in the x2 direction. In another example, the positional relation may be opposite between the gate layer 24B and the sensor layer 25B in the x direction. The sensor layer 25B is electrically connected to the first electrode layers 121 (source electrode) of the semiconductor chips 10B via wires 6 (sensor wires 62).

As shown in FIGS. 2 and 10, the block members 29 are disposed between the conductive substrate 22A and specific portions of the input terminal 42. The block members 29 are spacer blocks disposed to fill the gap present between the conductive substrate 22A and the input terminal 42 (at extended portions 421b described later) in the z direction. The block members 29 are electrically insulative and may be made of a ceramic material. The block members 29 have the shape of a pillar that is rectangular in plan view. The block members 29 are not limited to any specific shape and may be circular or polygonal in plan view. Each block member is bonded to the observe surface 221A of the conductive substrate 22A via a non-illustrated bonding material, and also to the input terminal 42 (an extended portion 421b) via a non-illustrated bonding material.

Each metal plate 31 is located between a semiconductor chip 10 and a lead member 5. In plan view, the metal plate 31 is rectangular. In plan view, the metal plate 31 is smaller than the semiconductor chip 10 and overlaps with the semiconductor chip 10. The metal plate 31 may be smaller than the semiconductor element 11 in z-direction dimension. The z-direction dimension of the metal plate 31 may be about 0.03 to 0.2 mm, for example. The metal plate 31 may be made of a metal containing copper, for example. To the metal plate 31, a portion of the lead member 5 is bonded. The metal plate 31 electrically connects the first electrode layer 121 of the semiconductor chip 10 to the lead member 5.

The plurality of metal plates 31 include a plurality of metal plates 31A and a plurality of metal plates 31B. Each metal plate 31A is disposed on a semiconductor chip 10A. The metal plate 31A is electrically bonded to the first electrode layer 121 of the semiconductor chip 10A via an electrically conductive bonding material 310A. Each metal plate 31B is disposed on a semiconductor chip 10B. The metal plate 31B is electrically bonded to the first electrode layer 121 of the semiconductor chip 10B via an electrically conductive bonding material 310B. The conductive bonding materials 310A and 310B are made of a sintered metal, for example. The construction material is not limited to a sintered metal. In another example, the construction material may be Ag paste or solder. The conductive bonding materials 310A and 310B may be collectively referred to as conductive bonding materials 310.

As shown in FIG. 12, each metal plate 31 has an obverse surface 311 and a reverse surface 312. The obverse surface 311 and the reverse surface 312 are spaced apart in the z direction. The obverse surface 311 faces in the z2 direction, and the reverse surface 312 in the z1 direction. The obverse surface 311 is in contact with a portion of the lead member 5 (a first bonding portion 511 or 521 described later). The reverse surface 312 is in contact with the conductive bonding material 310 and faces the corresponding semiconductor chip 10.

The two input terminals 41 and 42 are plates made of metal which may be copper or a copper alloy, for example. Each of the input terminals 41 and 42 may have a z-direction dimension of about 0.8 mm, for example. As shown in FIGS. 4 and 6, the input terminals 41 and 42 are located closer to an end of the semiconductor device A1 in the x2 direction. A source voltage may be applied between the two input terminals 41 and 42. The source voltage may be applied directly from a non-illustrated power or via a bus bar (not shown) sandwiched between the input terminals 41 and 42. Also, a snubber circuit may be connected in parallel. The input terminal 41 is a positive electrode (P terminal), and the input terminal 42 is a negative electrode (N terminal). The input terminal 42 is spaced apart from both the input terminal 41 and the conductive substrate 22A in the z direction.

As shown in FIGS. 4 and 10, the input terminal 41 has a pad portion 411 and a terminal portion 412.

The pad portion 411 is a portion of the input terminal 41 covered with the resin member 7. The pad portion 411 includes a plurality of prongs 411a at an end in the x1 direction, forming a comb-like shape. In another example, the prongs 411a may be omitted, in which case the pad portion 411 may be rectangular in plan view. The prongs 411a are electrically bonded to the observe surface 221A of the conductive substrate 22A. The method for bonding the prongs 411a to the conductive substrate 22A is not specifically limited. The bonding may be done by welding using a laser beam (hereinafter, laser welding), by ultrasonic welding, or via a conductive bonding material.

The terminal portion 412 is a portion of the input terminal 41 exposed from the resin member 7. In plan view as shown in FIGS. 4, 6 and 10, the terminal portion 412 extends out from the resin member 7 in the x2 direction. The terminal portion 412 may be plated with silver, for example.

As shown in FIGS. 4 and 10, the input terminal 42 has a pad portion 421 and a terminal portion 422.

The pad portion 421 is a portion of the input terminal 42 covered with the resin member 7. The pad portion 421 includes a connecting portion 421a and a plurality of extended portions 421b. The connecting portion 421a has a band shape elongated in the y direction. The connecting portion 421a connects from the terminal portion 422. Each extended portions 421b has a band shape extending from the connecting portion 421a in the x1 direction. The extended portions 421b are spaced apart from each other in the y direction in plan view. Each extended portion 421b has an end that overlaps with a block member 29 in plan view. The end of the extended portion 421b is bonded to the block member 29 by a non-illustrated bonding material. The end of the extended portion 421b is located away from the connecting portion 421a in the x1 direction. The extended portion 421b and the block member 29 may be bonded by laser welding or ultrasonic bonding, rather than by using a bonding material.

The terminal portion 422 is a portion of the input terminal 42 exposed from the resin member 7. As shown in FIGS. 4, 6 and 10, the terminal portion 422 extends out from the resin member 7 in the x2 direction in plan view. The terminal portion 422 is rectangular in plan view. As shown in FIG. 4, the terminal portion 422 overlaps with the terminal portion 412 of the input terminal 41 in plan view. The terminal portion 422 is spaced apart from the terminal portion 412 in the z2 direction. The terminal portion 422 has the same shape as the terminal portion 412. The terminal portion 422 may be plated with silver, for example.

The output terminal 43 is a plate made of metal, which for example is copper or a copper alloy. As shown in FIGS. 2, 4, 6, 10 and 11, the output terminal 43 is located closer to an end of the semiconductor device A1 in the x1 direction. That is, the output terminal 43 is located opposite from the input terminals 41 and 42 in the x direction. The output terminal 43 outputs AC power (voltage) converted by the semiconductor chips 10.

As shown in FIGS. 4 and 10, the output terminal 43 has a pad portion 431 and a terminal portion 432.

The pad portion 431 is a portion of the output terminal 43 covered with the resin member 7. The pad portion 431 includes a plurality of prongs 431a at an end of the in the x2 direction, forming a comb-like shape. In another example, the prongs 431a mat be omitted, in which case the pad portion 431 may be rectangular in plan view. The prongs 431a are electrically bonded to the observe surface 221B of the conductive substrate 22B. The prongs 431a are bonded to the conductive substrate 22B by a similar method to the method for bonding the prongs 411a to the conductive substrate 22A.

The terminal portion 432 is a portion of the output terminal 43 exposed from the resin member 7. As shown in FIGS. 2, 3, 4, 6 7, 10 and 11, the terminal portion 432 extends out from the resin member 7 in the x1 direction. The terminal portion 432 may be plated with silver, for example.

As shown in FIGS. 1 to 7, the gate terminals 44A and 44B are adjacent to the respective conductive substrates 22A and 22B in the y direction. The gate voltage for driving the semiconductor chips 10A is applied at the gate terminal 44A. The gate voltage for driving the semiconductor chips 10B is applied at the gate terminal 44B.

As shown in FIGS. 4 and 5, each of the gate terminals 44A and 44B has a pad portion 441 and a terminal portion 442. The pad portions 441 of the gate terminals 44A and 44B are covered with the resin member 7. The gate terminals 44A and 44B are hence supported by the resin member 7. The pad portions 44 may be plated with silver, for example. The terminal portions 442 are connected from the respective pad portions 441 and exposed from the resin member 7. Each terminal portions 442 has an L-shape as viewed in the x direction.

As shown in FIGS. 1 to 7, the sensor terminals 45A and 45B are adjacent to the respective gate terminals 44A and 44B in the x direction. The sensor terminal 45A is used for detection of the voltage applied to the first electrode layers 121 of the semiconductor elements 11 of the semiconductor chips 10A (i.e., voltage corresponding to the source current). The sensor terminal 45B is used for detection of the voltage applied to the first electrode layers 121 of the semiconductor elements 11 of the semiconductor chips 10B (i.e., voltage corresponding to the source current).

As shown in FIGS. 4 and 5, each of the sensor terminals 45A and 45B has a pad portion 451 and a terminal portion 452. The pad portions 451 of the sensor terminals 45A and 45B are covered with the resin member 7. The sensor terminals 45A and 45B are hence supported by the resin member 7. The pad portions 451 may be plated with silver, for example. The terminal portions 452 are connected to the respective pad portions 451 and exposed from the resin member 7. Each terminal portions 452 has an L-shape as viewed in the x direction.

As shown in FIGS. 1 to 7, the dummy terminals 46 include those adjacent to the gate terminal 44A on the side away from the sensor terminal 45A in the x direction, and those adjacent to the gate terminal 44B on the side away from the sensor terminal 45B in the x direction. In the present embodiment, six dummy terminals 46 are provided. Three of the six dummy terminals 46 are located on one side in the x direction (the x2 direction), and the other three dummy terminals 46 are located on the other side in the x direction (the x1 direction). The arrangement of the dummy terminals 46 is not limited to the example described above. In addition, the dummy terminals 46 may be omitted.

As shown in FIGS. 4 and 5, each dummy terminal 46 has a pad portion 461 and a terminal portion 462. The pad portions 461 of the respective dummy terminals 46 are covered with the resin member 7. The dummy terminals 46 are hence supported by the resin member 7. The pad portions 461 may be plated with silver, for example. The terminal portions 462 are connected to the respective pad portions 461 and exposed from the resin member 7. Each terminal portions 462 has an L-shape as viewed in the x direction. The terminal portions 462 have the same shape as the terminal portions 442 of the gate terminals 44A and 44B, and also as the terminal portions 452 of the sensor terminals 45A and 45B.

As shown FIG. 4, the side terminals 47A and 47B overlap with the resin member 7 in plan view, at the portions of the resin member 7 located along the y1 direction edge and the opposite edges in the x direction. The side terminal 47A is bonded to the conductive substrate 22A and covered by the resin member 7 except at the end face facing in the x2 direction. The side terminal 47B is bonded to the conductive substrate 22B and covered by the resin member 7 except at the end face facing in the x1 direction. In the present embodiment, the entire side terminals 47A and 47B overlap with the resin member 7 in plan view. The bonding of the side terminals 47A and 47B to the conductive substrates 22A and 22B is done by laser welding using a laser beam. Instead of bonding by laser welding, it is applicable to use ultrasonic bonding or bonding by an electrically conductive bonding material to join the side terminal 47A to the conductive substrate 22A and the side terminal 47B to the conductive substrate 22B. Each of the side terminals 47A and 47B has a bend in plan view and another bend in the z direction. The side terminals 47A and 47B are not limited to such a configuration and may protrude from the resin member 7 in plan view. In another example, the semiconductor device A1 may be without the side terminals 47A and 47B.

As shown in FIGS. 1 to 7, the gate terminals 44A and 44B, the sensor terminals 45A and 45B, and the dummy terminals 46 are arranged next to each other in the x direction in plan view. In the manufacture of the semiconductor device A1, the gate terminals 44A and 44B, the sensor terminals 45A and 45B, the dummy terminals 46 and the side terminals 47A and 47B are all formed from one leadframe.

The insulating plate 49 is electrically insulative and may be made of a sheet of insulating paper, for example. As shown in FIGS. 4, 6, 9, 10 and 11, the insulating plate 49 has a flat portion sandwiched between the terminal portion 412 of the input terminal 41 and the terminal portion 422 of the input terminal 42 in the z direction. In plan view, the insulating plate 49 overlaps with the entire input terminal 41. As for the input terminal 42, the insulating plate 49 overlaps with a part of the pad portion 421 and the entire terminal portion 422 in plan view. The insulating plate 49 electrically isolates the two input terminals 41 and 42 from each other. The insulating plate 49 has a portion (an end portion in the x1 direction) covered with the resin member 7.

As shown in FIGS. 4 and 10, the insulating plate 49 has an intervening portion 491 and an extended portion 492. The intervening portion 491 is disposed between the terminal portion 412 of the input terminal 41 and the terminal portion 422 of the input terminal 42 in the z direction. The entire intervening portion 491 is disposed between the terminal portion 412 and the terminal portion 422. The extended portion 492 connected from the intervening portion 491 extends in the x2 direction beyond the terminal portion 412 and the terminal portion 422.

The lead members 5 are electrically conductive. The lead members 5 may be made of a metal containing copper, for example. Each lead member 5 is bonded to a semiconductor chip 10 (a first electrode layer 121) via a metal plate 31. The lead member 5 may be formed by bending a strip of a metal plate having a thickness of about 0.05 to 0.2 mm. As shown in FIGS. 2, 4, 5, 10 and 11, the lead members 5 include a plurality of first leads 51 and a plurality of second leads 52.

As shown in FIGS. 2, 4, 5 and 11, the first leads 51 connect the semiconductor chips 10A to the conductive substrate 22B. Each first lead 51 includes a first bonding portion 511, a second bonding portion 512 and a connecting portion 513.

The first bonding portion 511 is bonded to the metal plate 31A that is bonded to the first electrode layer 121 of the corresponding semiconductor chip 10A. The bonding of the first bonding portion 511 to the metal plate 31A is done by laser welding. The first bonding portion 511 is electrically connected to the first electrode layer 121 of the semiconductor chip 10A via the metal plate 31. The first bonding portion 511 has a plurality of weld marks 8. The weld marks 8 on the first bonding portion 511 are located in a matrix pattern in plan view.

The second bonding portion 512 is bonded to the conductive substrate 22B. The bonding of the second bonding portion 512 to the conductive substrate 22B is done by laser welding. The laser welding technique used for bonding the second bonding portion 512 is the same as the technique used for the first bonding portion 511. The second bonding portion 512 has a plurality of weld marks 8. The weld marks 8 on the second bonding portion 512 are located in a matrix pattern in plan view. Instead of bonding by laser welding, the second bonding portion 512 may be joined to the conductive substrate 22B by an electrically conductive bonding material, such as a silver paste or solder, or by ultrasonic bonding.

The connecting portion 513 connects the first bonding portion 511 to the second bonding portion 512. The connecting portion 513 is bent in the z direction, such that the connecting portion 513 can connect the first bonding portion 511 and the second bonding portion 512 located at different levels in the z direction.

In the present embodiment, a first lead 51 corresponds to the "connecting member" recited in the claims. In this case, the semiconductor element 11 of a semiconductor chip 10A corresponds to the "semiconductor element" recited in the claims, a metal plate 31A to the "electrode member", the conductive substrate 22A to the "first conductive member", and the conductive substrate 22B to the "second conductive member".

As shown in FIGS. 2, 4, 5 and 10, the second leads 52 connect the semiconductor chips 10B to the input terminal 42. Each second lead 52 includes a first bonding portion 521, a second bonding portion 522 and a connecting portion 523.

The first bonding portion 521 is bonded to the metal plate that is bonded to the first electrode layer 121 of the corresponding semiconductor chip 10B. The first bonding portion 521 is electrically connected to the first electrode layer 121 of the semiconductor chip 10B via the metal plate 31. The first bonding portion 521 has a plurality of weld marks 8. The weld marks 8 on the first bonding portion 521 are located in a matrix pattern in plan view.

The second bonding portion 522 is bonded to an extended portion 421b of the input terminal 42. The bonding of the second bonding portion 522 to the extended portion 421b is done by laser welding. The laser welding technique used for the second bonding portion 522 is the same as the technique used for the first bonding portion 511. The second bonding portion 522 has a plurality of weld marks 8. The weld marks 8 formed on the second bonding portion 522 are located in a matrix pattern in plan view. Instead of bonding by laser welding, the second bonding portion 522 may be bonded to the extended portion 421b (the input terminal 42) by an electrically conductive bonding material, such as a silver paste or solder or by ultrasonic bonding.

The connecting portion 523 connects the first bonding portion 521 to the second bonding portion 522. The connecting portion 523 is bent in the z direction, such that the connecting portion 523 can connect the first bonding portion 521 and the second bonding portion 522 located at different levels in the z direction.

In the present embodiment, a second lead 52 corresponds to the "connecting member" recited in the claims. In this case, the semiconductor element 11 of a semiconductor chip 10B corresponds to the "semiconductor element" recited in the claims, a metal plate 31B to the "electrode member", the conductive substrate 22B to the "first conductive member", and the input terminal 42 to the "second conductive member".

The wires 6 are bonding wires. The wires 6 are electrically conductive and made of aluminum, gold or copper. As shown in FIGS. 4 and 5, the wires 6 include a plurality of gate wires 61, a plurality of sensor wires 62, a pair of first connecting wires 63 and a pair of second connecting wires 64.

As shown in FIGS. 4 and 5, each gate wire 61 has one end bonded to the second electrode layer 122 (gate electrode) of a semiconductor chip 10 and the other end bonded to the gate layer 24A or 24B. The gate wires 61 include those electrically connecting the second electrode layers 122 of the semiconductor chips 10A to the gate layer 24A and those electrically connecting the second electrode layers 122 of the semiconductor chips 10B to the gate layer 24B.

As shown in FIGS. 4 and 5, each sensor wire 62 has one end bonded to the first electrode layer 121 (source electrode) of a semiconductor chip 10 and the other end bonded to the sensor layer 25A or 25B. The sensor wires 62 include those electrically connecting the first electrode layers 121 of the semiconductor chips 10A to the sensor layer 25A and those electrically connecting the first electrode layers 121 of the semiconductor chips 10B to the sensor layer 25B.

As shown in FIGS. 4 and 5, one of the first connecting wires 63 connects the gate layer 24A to the gate terminal 44A, and the other connects the gate layer 24B to the gate terminal 44B. More specifically, one of the first connecting wires 63 has one end bonded to the gate layer 24A and the other end to the pad portion 441 of the gate terminal 44A to establish electrical connection. The other first connecting wire 63 has one end bonded to the gate layer 24B and the other end to the pad portion 441 of the gate terminal 44B to establish electrical connection.

As shown in FIGS. 4 and 5, one of the second connecting wires 64 connects the sensor layer 25A to the sensor terminal 45A, and the other connects the sensor layer 25B to the sensor terminal 45B. More specifically, one of the second connecting wire 64 has one end bonded to the sensor layer 25A and the other end to the pad portion 451 of the sensor terminal 45A to establish electrical connection. The other second connecting wire 64 has one end bonded to the sensor layer 25B and the other end to the pad portion 451 of the sensor terminal 45B to establish electrical connection.

The resin member 7 is made of a material suitable for sealing semiconductor components of the semiconductor device A1. In the example shown in FIGS. 1 to 4 and 6 to 11, the resin member 7 covers the semiconductor chips 10, and also the support substrate 20 (excluding the reverse surface 212 of the insulating substrate 21), the metal plates 31, a portion of each of the terminals 40, a portion of the insulating plate 49, the lead members 5 and the wires 6. The resin member 7 may be made of an epoxy resin, for example. As shown in FIGS. 1 to 4 and 6 to 11, the resin member 7 has a resin obverse surface 71, a resin reverse surface 72 and resin side surfaces 731 to 734.

The resin obverse surface 71 is spaced apart from the resin reverse surface 72 in the z direction. The resin obverse surface 71 is an upper surface of the resin member 7 facing in the z2 direction. The resin reverse surface 72 is a lower surface of the resin member 7 facing in the z1 direction. As shown in FIG. 7, the resin reverse surface 72 has the shape of a frame surrounding the reverse surface 212 of the insulating substrate 21 in plan view. Each of the resin side surfaces 731 to 734 is located between the resin obverse surface 71 and the resin reverse surface 72 to connect the resin obverse surface 71 and the resin reverse surface 72. The resin side surfaces 731 and 732 are spaced apart in the x direction, with the resin side surface 731 facing in the x1 direction and the resin side surface 732 in the x2 direction. The resin side surfaces 733 and 734 are spaced apart in the y direction, with the resin side surface 733 facing in the y1 direction and the resin side surface 734 in the y2 direction.

As shown in FIGS. 1, 6 and 7, the resin member 7 has a plurality of recesses 75 recessed from the resin reverse surface 72 in the z direction. In another example, the recesses 75 may be omitted. In plan view, each recess 75 extends across the resin reverse surface 72 in the y direction, from the y1-direction edge to the y2-direction edge. As shown in FIG. 7, the semiconductor device A1 has three recesses 75 along either side in the x direction of the reverse surface 212 of the insulating substrate 21.

Figure 13:
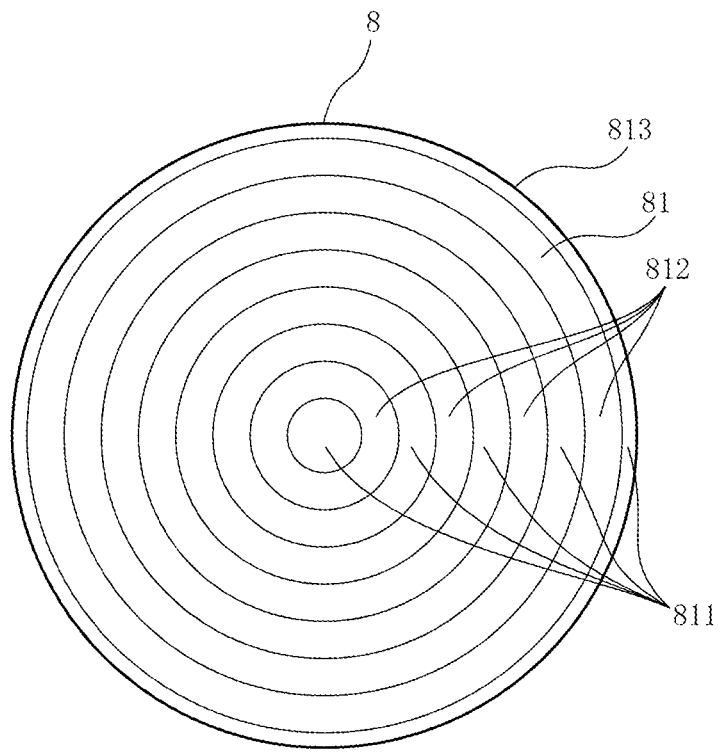
FIG. 13 is a schematic plan view of an example of a weld mark.
Figure 14:
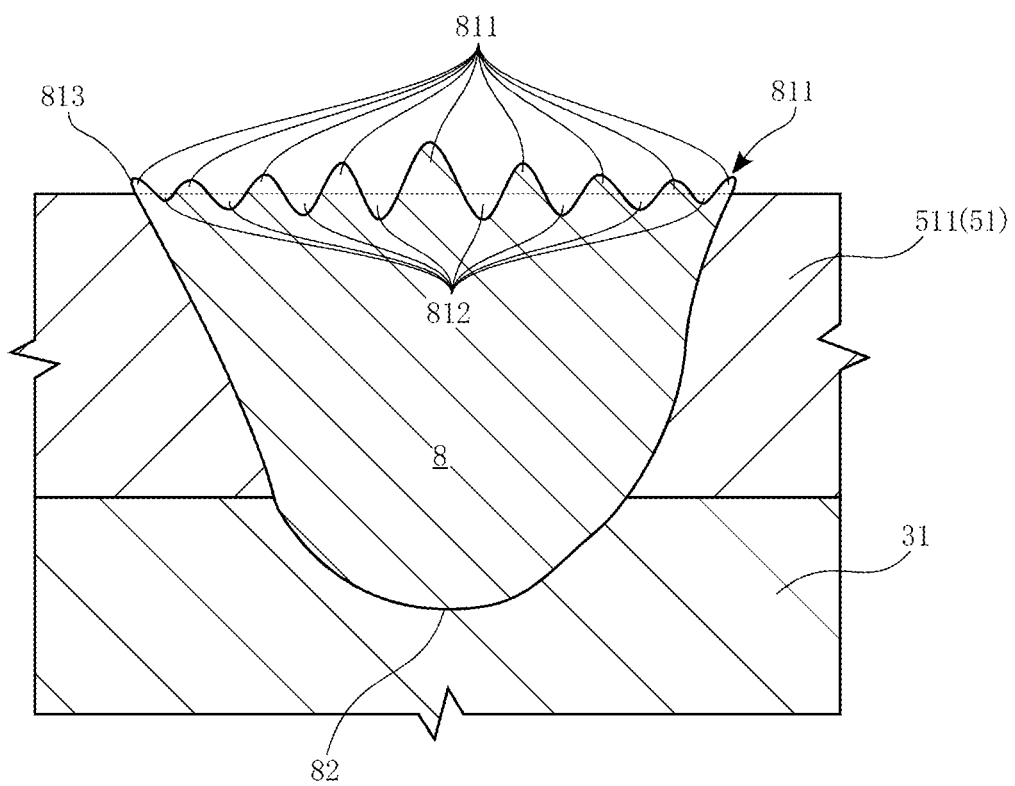
FIG. 14 is a schematic sectional view of an example of a weld mark.

The weld marks 8 are formed by a laser welding process, which will be described later. FIG. 13 is a schematic plan view of a weld mark 8. FIG. 14 is a schematic sectional view of a weld mark 8. Although FIG. 14 shows a weld mark 8 formed on a joint between the first bonding portion 511 of the first lead 51 and the metal plate 31, the weld marks 8 formed on other components have the characteristics described below.

As shown in FIG. 13, the weld mark 8 is circular in plan view. The weld mark 8 has a pattern of circular ripples on the upper surface 81 of the facing in the z2 direction. More specifically, the upper surface 81 of the weld mark 8 is formed with a series of concentric crests 811 and troughs 812 as shown in FIG. 14. Although the weld mark 8 shown in FIG. 13 has a circumferential edge 813 and the circular ripple pattern (the crests 811 and troughs 812) that are truly circular, some degree of distortion or irregular curves may be present in practice. As shown in FIG. 14, the center portion of the weld mark 8 in plan view is formed with a crest 811 and thus protrudes in the z2 direction. The weld mark 8 has an end in the z1 direction (bottom 82) that overlaps with the metal plate 31 as viewed in a direction perpendicular the z direction. That is, the bottom 82 is located between the obverse surface 311 and the reverse surface 312 in the z direction.

The following describes a method for bonding the lead members to the semiconductor chips 10 by laser welding. In the manufacture of the semiconductor device A1, this bonding method is used to bond a first lead 51 to a semiconductor chip 10A and also to bond a second lead 52 to a semiconductor chip 10B. The bonding method is also used to bond a first lead 51 to the conductive substrate 22B and also to bond a second lead 52 to the input terminal 42.

First, a metal plate 31 is bonded to a semiconductor chip 10. The metal plate 31 is bonded to the first electrode layer 121 of the semiconductor chip 10 by a conductive bonding material 310. The conductive bonding material 310 may in advance be applied to the first electrode layer 121 of the semiconductor chip 10 or laminated on the metal plate 31. The metal plate 31 may be bonded either before or after mounting the semiconductor chip 10 on the corresponding conductive substrate 22. By this step of bonding the metal plate 31, the metal plate 31 is electrically connected to the first region 111 of the semiconductor element 11 of the semiconductor chip 10. Since the first electrode layer 121 is formed on the element obverse surface 11a of the semiconductor element 11, the metal plate 31 is disposed on the element obverse surface 11a.

Subsequently, a lead member 5 is bonded to the metal plate 31. This bonding begins with placing the lead member 5 on the metal plate 31. Then, the lead member 5 is bonded to the metal plate 31 by laser welding of a portion of the lead member 5 that overlaps with the metal plate 31 in plan view. In this way, the lead member 5 and the metal plate 31 are welded, causing the lead member 5 and the metal plate 31 to be joined together.

Through the first step and the second step described above, each lead member 5 is bonded to the first electrode layer 121 of a semiconductor chip 10 via a metal plate 31.

Next, the process of laser welding according to the present embodiment will be described. The laser welding process is performed by using a laser emitting device LD (see FIG. 15) described below. The laser welding process is a type of spot welding.

Figure 15:
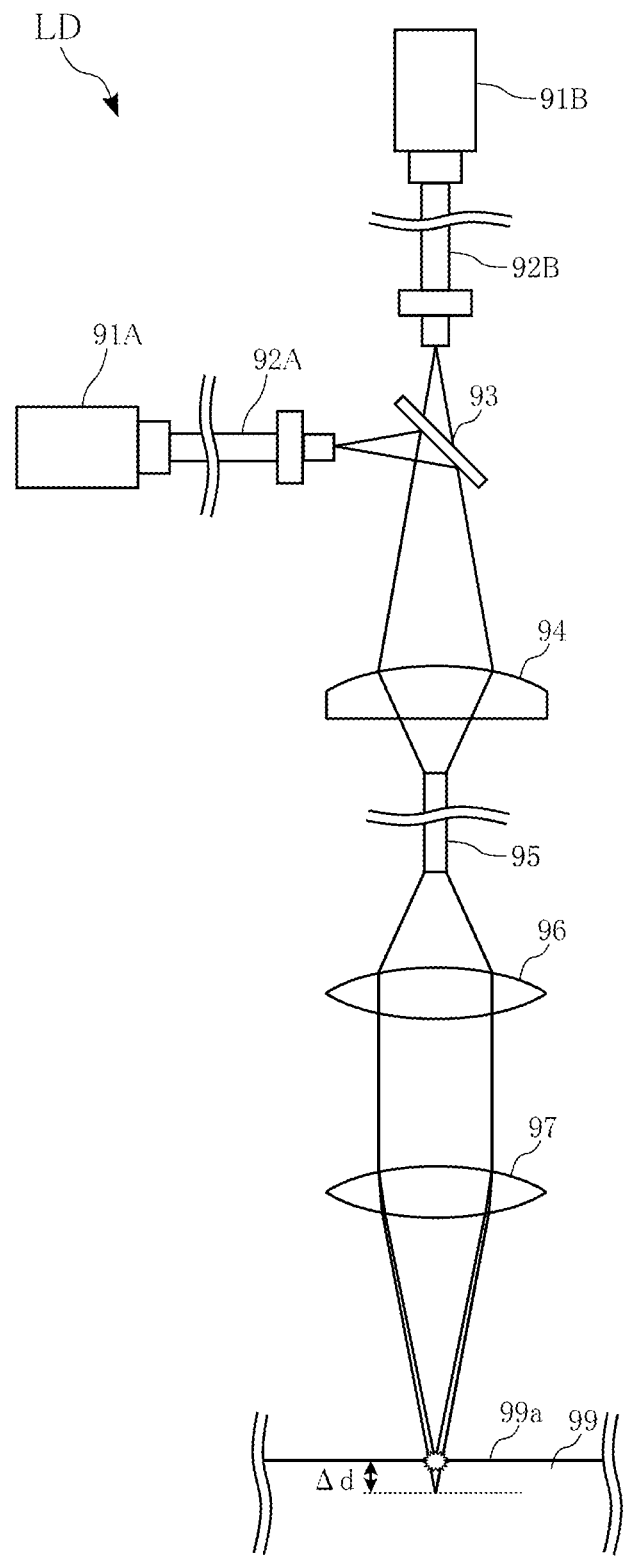
FIG. 15 is a schematic view of an example of a laser emitting device.

FIG. 15 shows one example of the laser emitting device LD. The laser emitting device LD shown in FIG. 15 includes laser oscillators 91A and 91B, optical fibers 92A and 92B, a dichroic mirror 93, a condensing lens 94, an optical fiber 95, a collimation lens 96 and a condensing lens 97.

The laser oscillators 91A and 91B produce laser beams. The laser oscillator 91A emits a first laser beam. The first laser beam is a green laser having a wavelength of about 532 nm. The laser oscillator 91B emits a second laser beam. The second laser beam is an infrared layer having a wavelength of about 1,064 nm. When the wavelength of the second laser beam is taken as the primary wavelength, the first laser beam has a half wavelength of the primary wavelength. The first laser beam is a multimode beam with the beam propagation ratio $M^2$ of about 1.6 to 3.5. The second laser beam is also a multimode beam with the beam propagation ratio $M^2$ of about 2.4 to 6.0.

The optical fiber 92A is provided for transmitting the first laser beam emitted by the laser oscillator 91A. The outgoing first laser beam from the optical fiber 92A is delivered to the to the dichroic mirror 93. The optical fiber 92B is provided for transmitting the second laser beam emitted by the laser oscillator 91B. The outgoing second laser beam from the optical fiber 92B is also delivered to the dichroic mirror 93.

The dichroic mirror 93 has properties of passing light of specific wavelengths and reflecting light of the other wavelengths, for example. Specifically, the dichroic mirror 93 has properties of reflecting the first laser beam and passing the second laser beam. In another example, the dichroic mirror 93 may have properties of passing the first laser beam and reflecting the second laser beam.

The condensing lens 94 condenses the laser beams having passed through the dichroic mirror 93. The optical fiber 95 is provided for transmitting the laser beams received from the condensing lens 94. The outgoing laser beams from the optical fiber 95 is delivered to the collimation lens 96. The collimation lens 96 collimates the laser beams received from the optical fiber 95 (into parallel light beams). The condensing lens 97 condenses the laser beams received from the collimation lens 96. The laser beams condensed by the condensing lens 97 is outputted to irradiate an irradiation target 99.

The laser emitting device LD is adjusted to focus the first laser beam substantially on the surface 99a of the irradiation target 99. The second laser beam is adjusted to be focused on a point slightly below the surface 99a of the irradiation target 99. In the present embodiment, the irradiation target 99 may be any of a portion of a first lead 51 overlapping with a metal plate 31A, a portion of a first lead 51 overlapping with the conductive substrate 22B, a portion of a second lead 52 overlapping with a metal plate 31B, and a portion of a second lead 52 overlapping with the input terminal 42. The first laser beam may have a beam diameter of about 0.15 to 0.25 mm, for example. The second laser beam may have a beam diameter of about 0.4 to 0.8 mm, for example.

Figure 16:
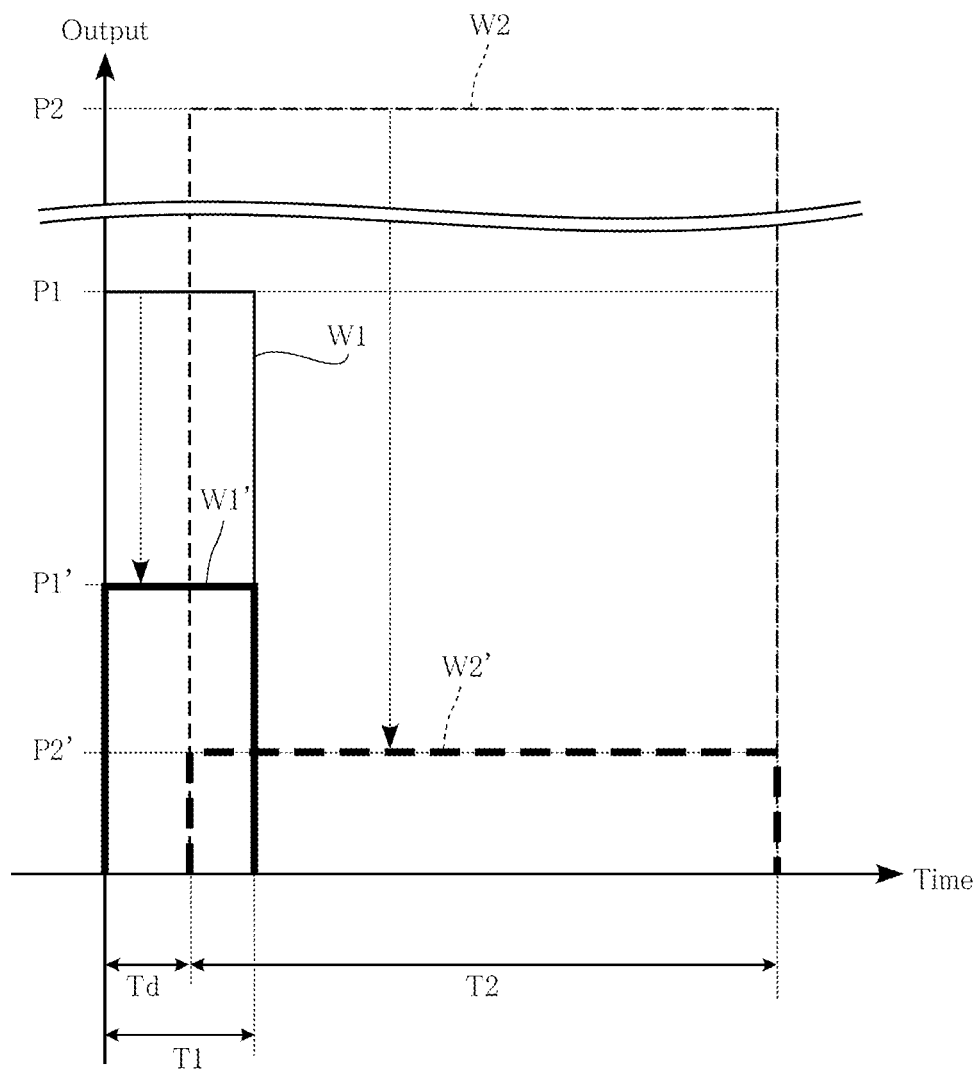
FIG. 16 is a timing chart showing output waveforms of two laser beams.

In the present embodiment, the laser emitting device LD used in the laser welding is adjusted to output the first and second laser beams as represented by the waveforms shown in FIG. 16, which is a timing chart of the outputted first laser beam and second laser beam. In FIG. 16, the waveform W1 represents the first laser beam outputted from the laser emitting device LD and the waveform W1' represents the first laser beam absorbed by the irradiation target 99. Similarly, the waveform W2 represents the second laser beam outputted from the laser emitting device LD and the waveform W2' represents the second laser beam absorbed by the irradiation target 99. The irradiation target 99 may be a lead member 5 as described above.

As indicated by the waveforms W1 and W2 in FIG. 16, the first laser beam and the second laser beam are pulsed laser beams having rectangular waveforms.

The output power P1 of the first laser beam from the laser emitting device LD (see waveform W1) is smaller than the output power P2 of the second laser beam from the laser emitting device LD (see waveform W2) (P1<P2). For example, the output power P1 of the first laser beam is about 1.0 to 1.2 kW, and the output power P2 of the second laser beam is about 1.5 to 2.5 kW. The irradiation target 99 does not absorb all the first laser beam outputted from the laser emitting device LD to the irradiation target 99. A portion of the first laser beam is reflected by the irradiation target 99. The power (intensity) P1' of the first laser beam absorbed by the irradiation target 99 is therefore smaller than the output power P1 of first laser beam (see waveform W1'). For example, the first laser beam absorbed by the irradiation target 99 made of Cu is about 45% of the first laser beam outputted from the laser emitting device LD. Similarly, the irradiation target 99 does not absorb all the second laser beam outputted from the laser emitting device LD to the irradiation target 99. A portion of the second laser beam is reflected by the irradiation target 99. The power (intensity) P2' of the second laser beam absorbed by the irradiation target 99 is therefore smaller than the output power P2 of second laser beam (see waveform W2'). For example, the second laser beam absorbed by the irradiation target 99 made of Cu is about 10% of the second laser beam outputted from the laser emitting device LD. In the present embodiment, the power (intensity) P1' of the first laser beam absorbed by the irradiation target 99 is larger than the power (intensity) P2' of the second laser beam absorbed by the irradiation target 99 (P1'>P2') as shown in FIG. 16.

The output duration (the irradiation time) T1 of the first laser beam is shorter than the output duration (the irradiation time) T2 of the second laser beam (T1<T2). For example, the output duration T1 of the first laser beam is about 1.0 to 1.3 ms, and the output duration T2 of the second laser beam is about 5 to 15 ms.

The second laser beam is outputted with a delay from the first laser beam. More specifically, the second laser beam is started to output in a predetermined delay time Td after the output of the first laser beam is started. In one example, the delay time Td is about 0.1 to 0.6 ms.

The second laser beam is started to output while the first laser beam is still being outputted (T1>Td). That is, for a certain duration, both the first laser beam and the second laser beam are outputted concurrently. In another example, the second laser beam may be outputted after output of the first laser beam ends (T1<Td). In this case, unlike the waveforms shown in FIG. 16, there is no duration in which the first laser beam and the second laser beam are concurrently outputted.

As described above, the first laser beam and the second laser are outputted as represented by the waveforms shown in FIG. 16. Consequently, the lead member 5 is irradiated first with the first laser beam, causing the irradiated portion of the lead member 5 to start to melt and form a molten pool.

During this time, the first laser beam incident on this molten pool forms circular ripples on the molten pool surface. Subsequently, the second beam is started to output while the first laser beam is still being outputted, causing the molten pool to expand downward. Eventually, the molten pool formed in the lead member 5 reaches the metal plate 31. While more portions are melted and the molten pool expands downward, the circular ripples formed on the molten pool surface remains present. Subsequently, the output of the first laser beam is stopped. Even after the first laser beam is stopped, melting by the second laser beam proceeds further. Subsequently, the output of the second laser beam is stopped. Then, melting stops and the molten pool is allowed to cool and solidify. In this way, the lead member 5 is welded to the metal plate 31, leaving the weld mark 8 at the welded portion (the portion irradiated with the laser beams). The circular ripples formed on the molten pool surface is solidified as they are, so that the ripple pattern is formed on the surface of the weld mark 8.

In the present embodiment, the laser welding process by the laser emitting device LD is also used to bond the first leads 51 (the second bonding portions 512) to the conductive substrate 22B and the second leads 52 (the second bonding portions 522) to the input terminal 42 (the extended portion 421*b*).

Advantages of the semiconductor device A1 of the first embodiment are described below.

The semiconductor device A1 includes a semiconductor element 11, a metal plate 31 and a lead member 5. The semiconductor element 11 has a first region 111 (a source region, for example) on the element obverse surface 11*a*. The metal plate 31 is disposed on the element obverse surface 11*a* and electrically connected to the first region 111. The lead member 5 is bonded to the metal plate 31 by laser welding. The lead member 5 is thus electrically connected to the first region 111 of the semiconductor element 11 via the metal plate 31. That is, the lead member 5 is electrically connect to the first region 111 of the semiconductor element 11 by bonding the lead member 5 to the metal plate 31 by laser welding. In other words, the lead member 5 and the semiconductor element 11 (the first region 111) are electrically connected without having to perform ultrasonic bonding. Since the semiconductor element 11 is not subjected to pressure and vibrations caused by ultrasonic bonding, damage of the semiconductor element 11 is prevented. The semiconductor device A1 therefore helps to improve reliability.

The semiconductor device A1 includes an element electrode 12. The element electrode 12 includes a first electrode layer 121 disposed to form an ohmic contact to the first region 111 of the semiconductor element 11. The first electrode layer 121 serves as an electrode pad of the semiconductor chip 10, and the metal plate 31 is bonded to the first electrode layer 121 via the conductive bonding material 310. With this configuration, an electrical connection between the metal plate 31 and the first electrode layer 121 is established by bonding the metal plate 31 to the first electrode layer 121 via the conductive bonding material 310. That is, the metal plate 31 and the first electrode layer 121 are electrically connected without having to perform ultrasonic bonding. In this way, the first electrode layer 121 and the metal plate 31 are bonded in a manner to prevent damage of the semiconductor element 11. The semiconductor device A1 therefore helps to improve reliability.

The semiconductor device A1 includes a metal plate 31 and a first electrode layer 121 bonded by the conductive bonding material 310. The conductive bonding material 310 is a sintered metal (sintered silver, for example). Bonding by a sintered metal achieves higher durability, such as resistance to heat, pressure and shock, than bonding by solder. This configuration serves to prevent damage or peeling of the conductive bonding material 310. The semiconductor device A1 therefore helps to improve reliability.

The semiconductor device A1 includes a first lead 51 (a lead member 5) having a first bonding portion 511 bonded to a metal plate 31A by laser welding. The laser welding leaves a weld mark 8 on the metal plate 31A. The weld mark 8 has a bottom 82 that overlaps with the metal plate 31A as viewed in a direction perpendicular to the z direction. In other words, the weld mark 8 does not penetrate through the metal plate 31A in the z direction. The same holds with respect to the first bonding portions 521 of the second leads 52 (lead members 5). That is, the lead member 5 is bonded to a metal plate 31 by laser welding that. The laser welding is performed without causing a molten pool formed by laser radiation to extend beyond the metal plate 31. Consequently, heat generated at the time of laser welding is prevented from reaching the semiconductor element 11. In this way, thermal damage of the semiconductor element 11 by laser welding is prevented. The semiconductor device A1 therefore helps to improve reliability.

The semiconductor device A1 includes a first lead 51 (a lead member 5) having a plurality of weld marks 8 formed on the first bonding portion 511. This indicates that the first lead 51 (the first bonding portion 511) is bonded to the metal plate 31A by irradiating a plurality of regions with a laser beam. Unlike the semiconductor device A1, a semiconductor device having a single weld mark 8 on a first bonding portion 511 may involve the following risk. That is, when a force is applied to such a first lead 51 in a direction perpendicular to the z direction, the first lead 51 may pivot about a z-direction axis that passes thorough the weld mark 8. In contrast, the semiconductor device A1 has a plurality of weld marks 8 on the first bonding portion 511, the risk of such pivoting is reduced. The same holds with respect to the second bonding portions 512 of the first leads 51 (the lead members 5), the first bonding portions 521 of the second leads 52 (the lead members 5), and the second bonding portions 522 of the second leads 52 (the lead members 5).

The semiconductor device A1 includes a first lead 51 (a lead member 5) having a first bonding portion 511 and a second bonding portion 512. The first bonding portion 511 and the second bonding portion 512 each have a plurality of weld marks 8. This indicates that the first bonding portion 511 and the second bonding portion 512 are each bonded by laser welding. The same holds with respect to the second leads 52 (the lead members 5). With this configuration, the first bonding portion 511 (521) and the second bonding portion 512 (522) are bonded by using the same bonding method, improving the efficiency of manufacturing the semiconductor device A1.

The semiconductor device A1 has a weld mark 8 having circular ripple pattern formed with crests 811 and troughs 812 on the upper surface 81. The upper surface 81 is in contact with the resin member 7. That is, the upper surface 81 of the weld mark 8 has an uneven surface, which is effective to produce anchoring effect of improving the adhesion strength of the resin member 7.

The semiconductor device A1 has a lead member 5 bonded to a metal plate 31 by laser welding. The laser welding is performed by applying the first laser beam and the second laser beam having mutually different wavelengths. That is, with the combined use of the two laser beams, the bonding method according to the present disclosure makes it possible to appropriately adjust the properties of laser output, including absorption, reflection, refraction and scattering, depending on the material of the laser irradiation target (the lead member 5). This permits the use of the metal plate 31 smaller than the semiconductor element 11 in z-direction dimension. In this way, the metal plate 31 can be provided between the lead member 5 and the first electrode layer 121 without causing the z-direction dimension of the semiconductor device A1 to be increased.

According to the bonding method of the present disclosure, the first laser beam has a shorter wavelength than the second laser beam. In the manufacture of the semiconductor device A1, the first laser beam is a green laser having wavelengths of about 532 nm, and the second laser beam is an infrared laser having wavelengths of about 1,064 nm. The laser welding of the present embodiment is intended for bonding a lead member 5 and a metal plate 31 both of which are made of copper, for example. Copper is known to have a higher absorbance of laser light at shorter wavelengths. For example, copper absorbs about 45% of light at wavelengths around 532 nm (the first laser beam), and about 10% of light at wavelengths around 1,064 nm (the second laser beam). That is, the bonding method according to the present embodiment uses two laser beams that will be absorbed differently by a bonding target.

The bonding method according to the present disclosure uses the laser emitting device LD to produce the first laser beam and the second laser beam having the output waveforms as shown in FIG. 16. The output power of the first laser beam is higher than the output power of the second laser beam. The irradiation time of the first laser beam is shorter than the irradiation time of the second laser beam. The second laser beam is started to output a delay time Td after the output of the first laser beam is started. That is, irradiation with the second laser beam is delayed from irradiation with the first laser beam. The second laser beam is started to output while the first laser beam is still being outputted. The first laser beam is absorbed better than the second laser beam by a bonding target (copper), but the power control thereof is more difficult. Therefore, although laser welding by the first laser beam alone may be effective to shorten the welding time, it poses a risk of forming a weld mark 8 penetrating through the metal plate 31. Conversely, the second laser beam may be easier to control than the first laser beam, but is absorbed less than the first laser beam by the bonding target (copper). Therefore, although laser welding by the second laser beam alone may be effective to prevent formation of a weld mark 8 penetrating through the metal plate 31, the time required for welding may need to be prolonged. The bonding method according to the present disclosure uses the first laser beam to initiate melting. Since the first laser beam is absorbed well by a bonding targeted (copper), the state of the molten pool is stabilized quickly. After the state of the molten pool is stabilized, the second laser beam is started to output, and the first laser beam is stopped. This enables development of the molten pool to be controlled by the second laser beam. In this way, the combined use of the first laser beam and the second laser beam having the waveforms shown in FIG. 16 facilitates effective laser welding while preventing damage of the semiconductor element 11. In addition, irradiation with the first laser beam before irradiation with the second laser beam is effective to prevent occurrence of spatter, which results in decrease in the welding quality.

The following describes semiconductor devices and bonding methods according to other embodiments. In the following description, the same or similar components to those of the first embodiment are denoted by the same reference signs and description thereof are omitted.

Second Embodiment

Figure 17:
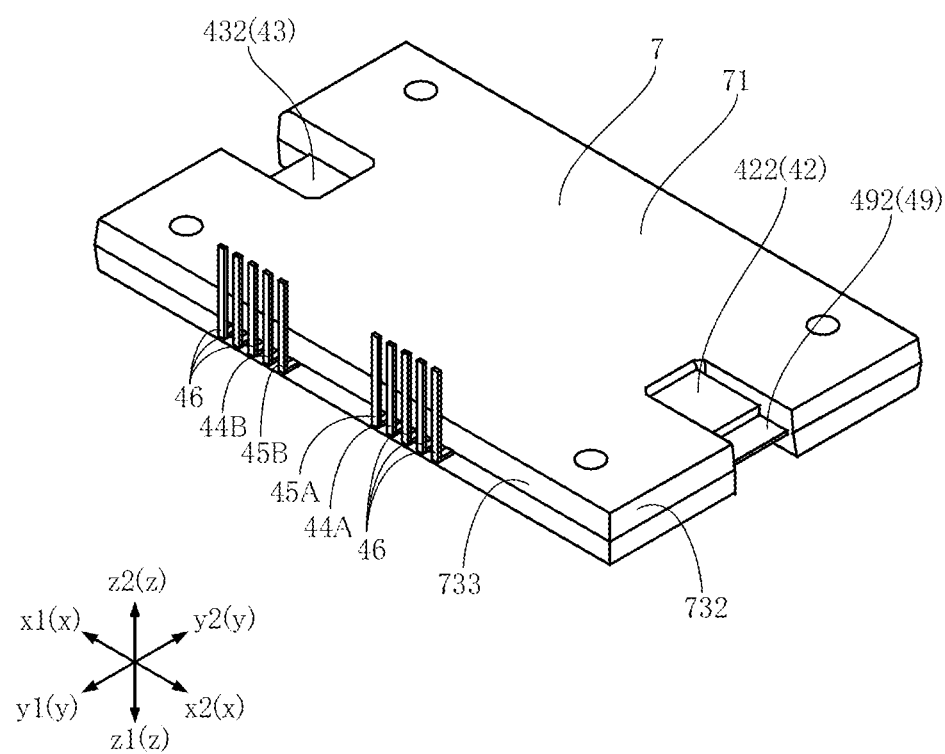
FIG. 17 is a perspective view of a semiconductor device according to a second embodiment.

FIG. 17 shows a semiconductor device according to a second embodiment. The semiconductor device A2 of the second embodiment includes a resin member 7 having a different shape from that of the semiconductor device A1. Other than that, the semiconductor device A2 is the same as the semiconductor device A1. FIG. 17 is a perspective view of the semiconductor device A2.

In plan view, the resin member 7 of the present embodiment has portions elongated in the x direction along the opposite edges in the y direction. The extended portions of the resin member 7 in the x2 direction cover portions of the two input terminals 41 and 42 and a portion of the insulating plate 49. The extended portions of the resin member 7 in the x1 direction cover portions of the output terminal 43.

Similarly to the semiconductor device A1, the semiconductor device A2 includes a lead member 5 bonded to a metal plate 31 by laser welding, providing electrical connection between the lead member 5 and the first region 111 of the semiconductor element 11. Consequently, like the semiconductor device A1, the semiconductor device A2 can prevent damage of the semiconductor element 11. The semiconductor device A2 therefore helps to improve reliability.

In addition, the resin member 7 of the semiconductor device A2 can protect the portions not covered by the resin member 7 of the semiconductor device A1, including the portions of the two input terminals 41 and 42, the portion of the output terminal 43 and the portion of the insulating plate 49.

Third Embodiment

FIGS. 18 to 22 show a semiconductor device according to a third embodiment. The semiconductor device A3 according to the third embodiment includes a plurality of semiconductor chips 10, a support substrate 20, a plurality of metal plates 31, a plurality of terminals 40, a plurality of lead members 5, a plurality of wires 6 and a resin member 7. The plurality of terminals 40 of the semiconductor device A3 include input terminals 41 and 42, an output terminal 43, a pair of gate terminals 44A and 44B, a pair of sensor terminals 45A and 45B, a plurality of dummy terminals 46, and a pair of source signal terminals 48A and 48B.

Figure 18:
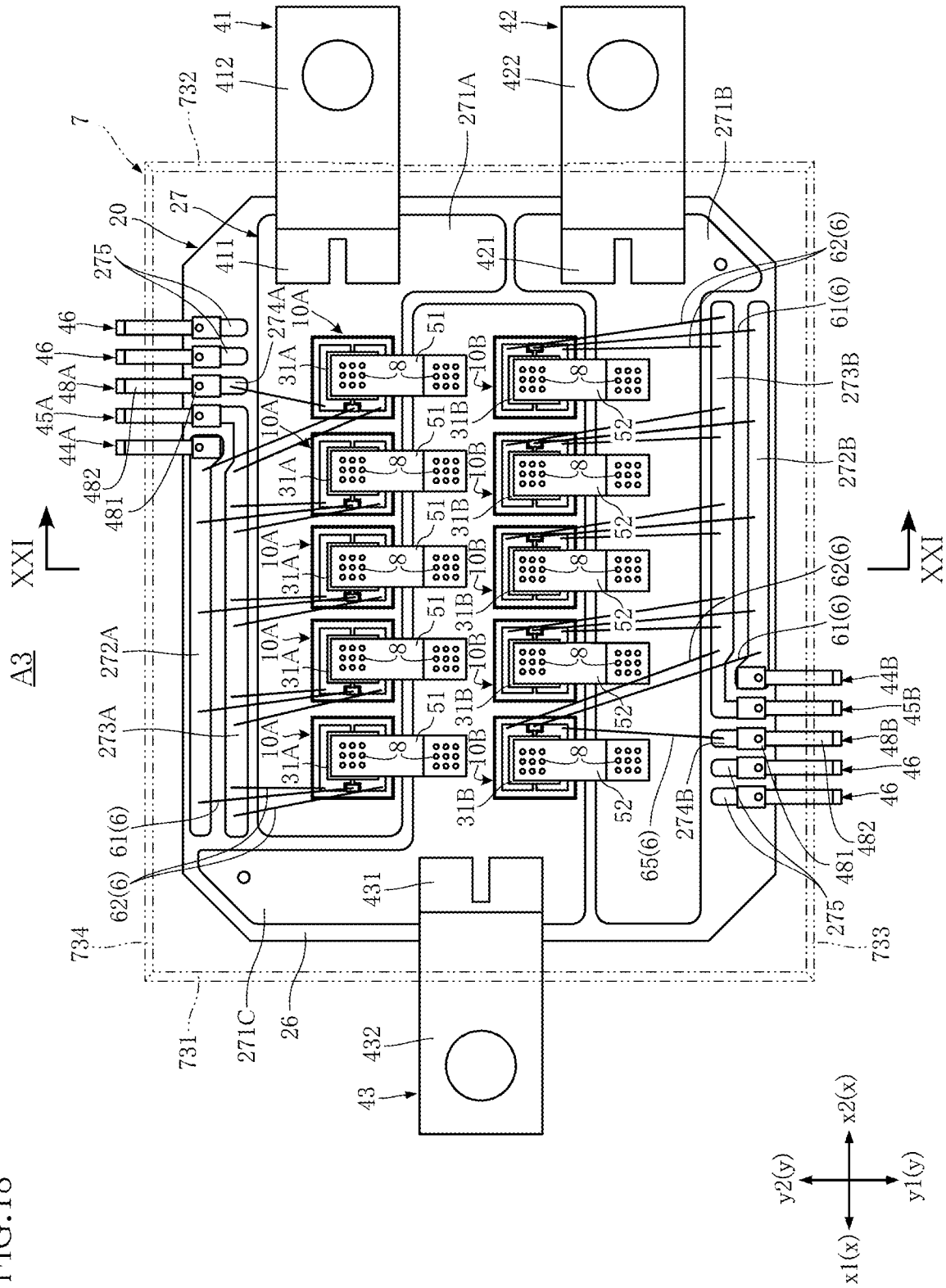
FIG. 18 is a plan view of a semiconductor device according to a third embodiment.
Figure 19:
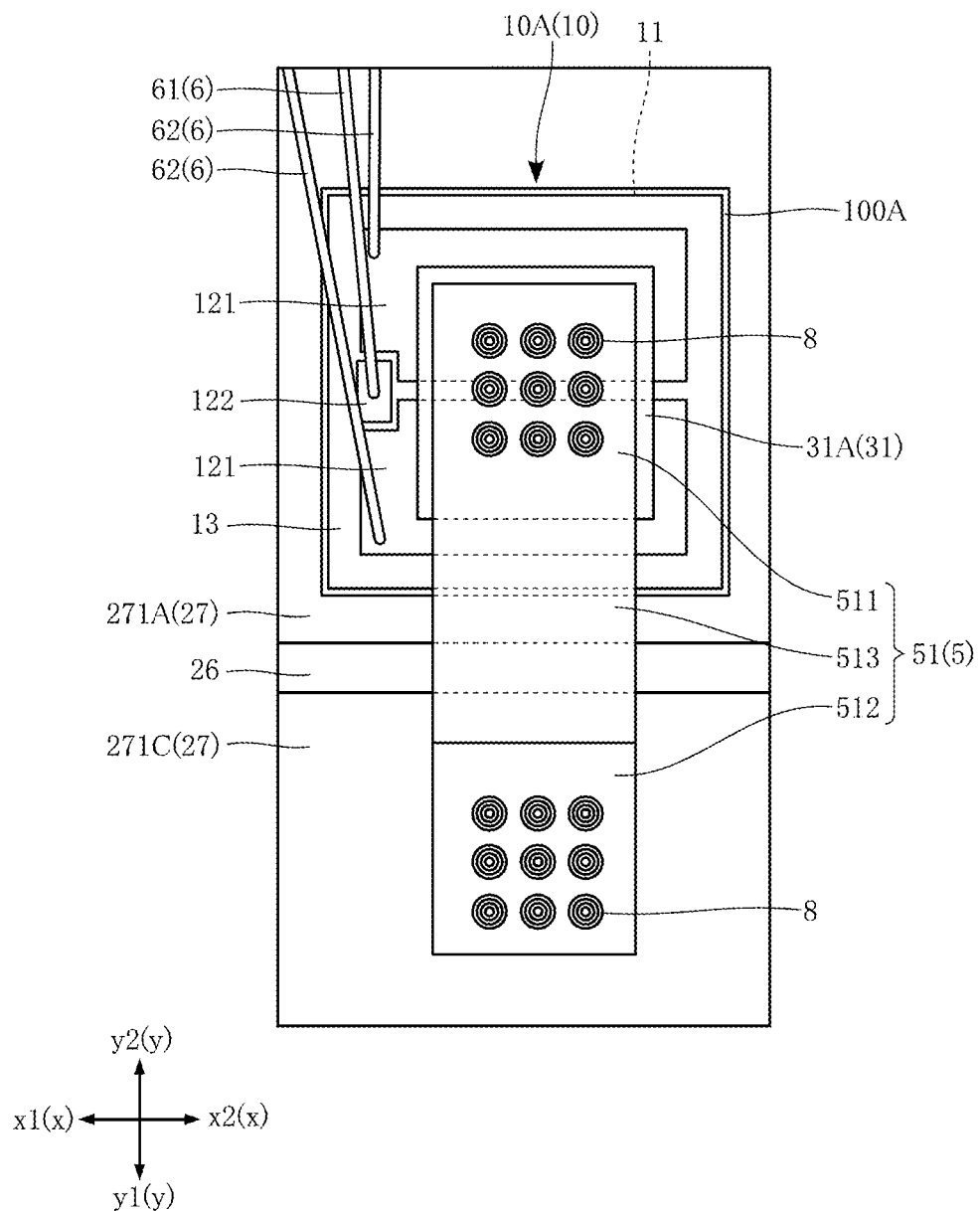
FIG. 19 is an enlarged view of a portion of FIG. 18.
Figure 20:
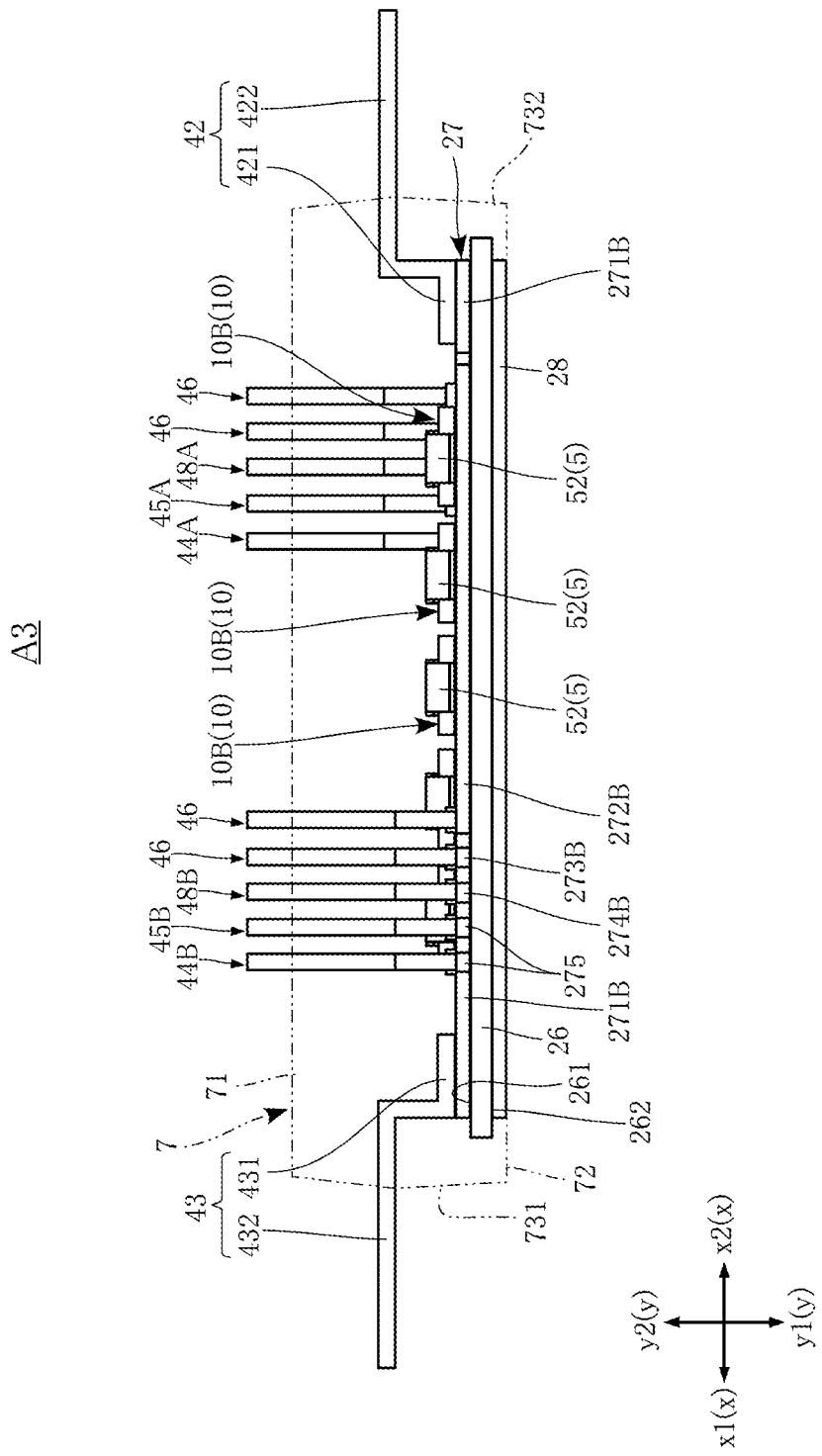
FIG. 20 is a front view of the semiconductor device according to the third embodiment.
Figure 21:
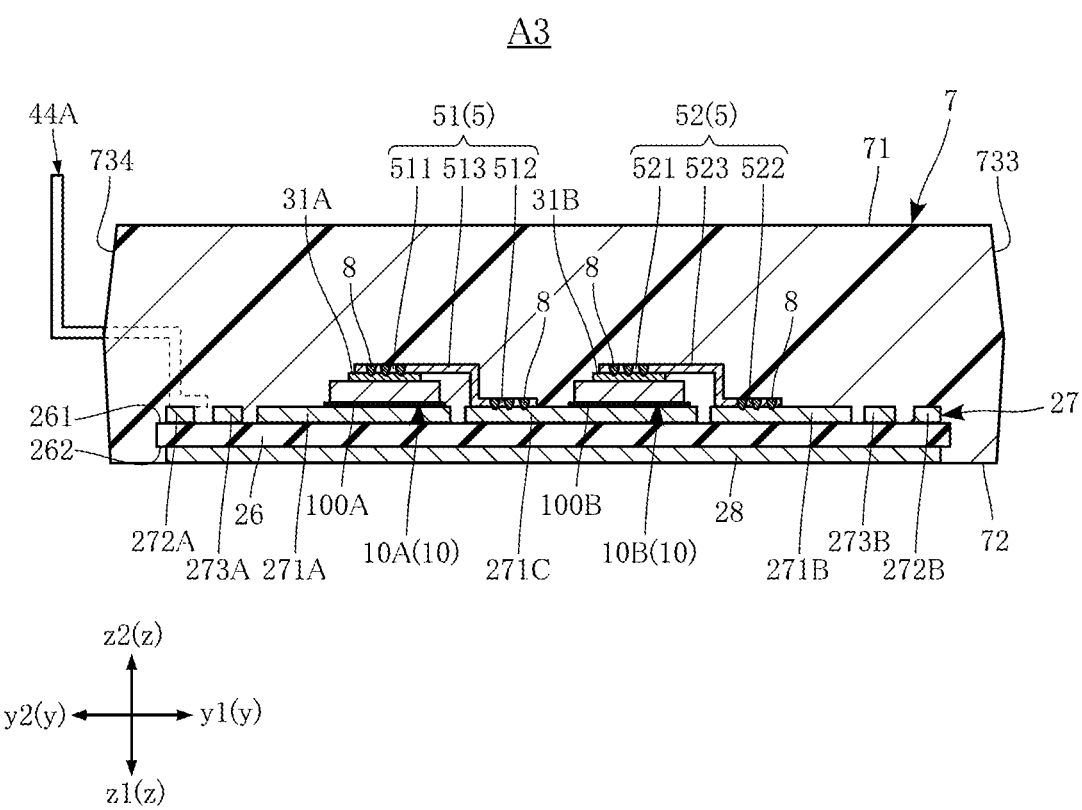
FIG. 21 is a sectional view taken along line XXI-XXI of FIG. 18.
Figure 22:
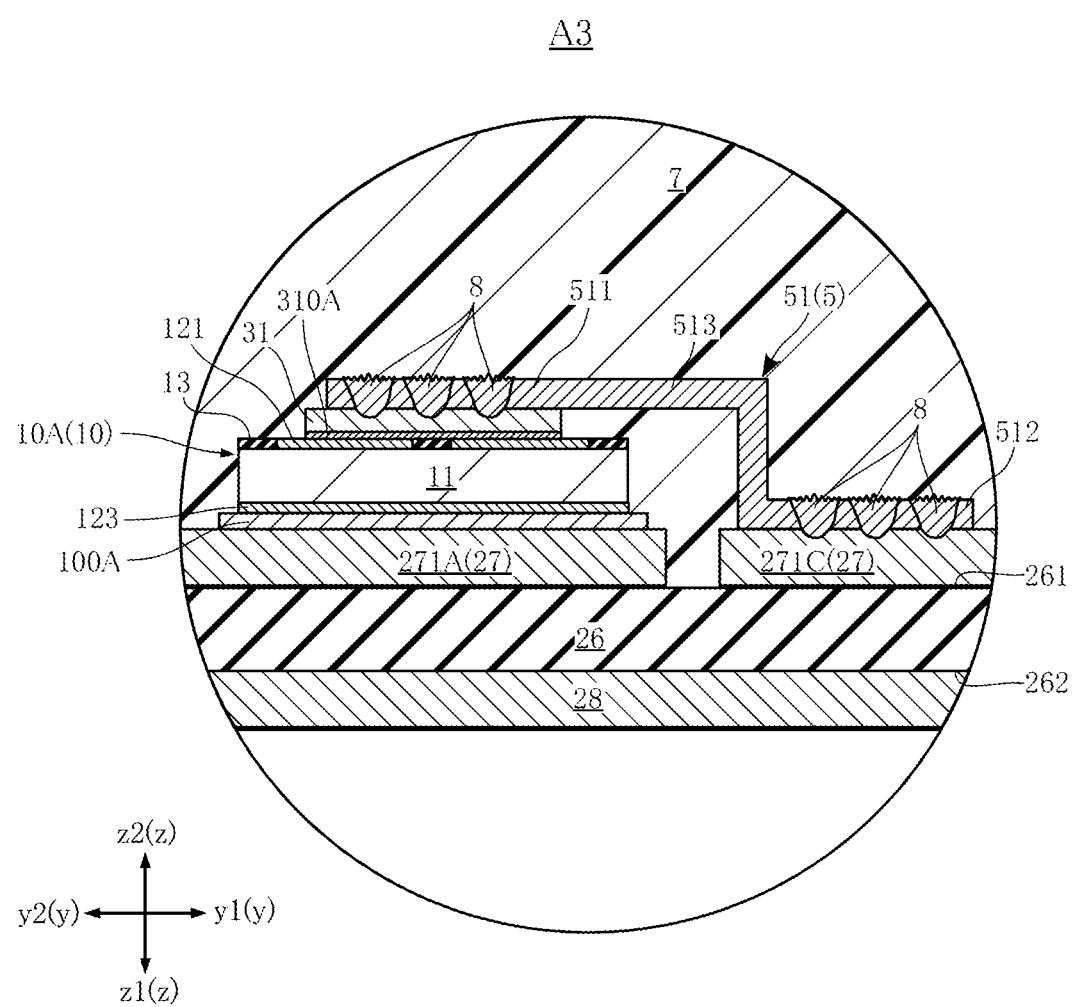
FIG. 22 is an enlarged view of a portion of FIG. 21.

FIG. 18 is a plan view of the semiconductor device A3, with the resin member 7 shown in phantom (in two-dot chain line). FIG. 19 is an enlarged view of a portion of FIG. 18. FIG. 20 is a front view of the semiconductor device A3, with the resin member 7 shown in phantom (in two-dot chain line). FIG. 20 omits the wires 6 for convenience. FIG. 21 is a sectional view taken along line XXI-XXI of FIG. 18. FIG. 22 is an enlarged view showing a portion of FIG. 21.

As shown in FIGS. 18 and 19, each semiconductor chip 10 of the semiconductor device A3 includes two first electrode layers 121 insulated by an insulating film 13. A metal plate 31 is bonded to the two first electrode layers 121 by the conductive bonding material 310. In an alternative example, each semiconductor chip 10 of this embodiment may include a single first electrode layer 121 as in the semiconductor chips 10 of the semiconductor device A1.

The support substrate 20 of the semiconductor device A3 has a different configuration from the support substrate 20 of the semiconductor device A1. As shown in FIGS. 20, 21 and 22, the support substrate 20 of this embodiment includes an insulating substrate 26, a plurality of obverse-surface metal layers 27 and a reverse-surface metal layer 28.

The insulating substrate 26 is electrically insulative. Like the insulating substrate 21, the insulating substrate 26 may be made of, but not limited to, a ceramic material. In another example, the insulating substrate 26 may be made of a sheet of insulating resin.

As shown in FIGS. 20 and 21, the insulating substrate 26 has an obverse surface 261 and a reverse surface 262. The obverse surface 261 and the reverse surface 262 are spaced apart from each other in the z direction. The obverse surface 261 faces in the z2 direction, and the reverse surface 262 in the z1 direction.

The obverse-surface metal layers 27 are formed on the obverse surface 261 of the insulating substrate 26. The obverse-surface metal layers 27 may be made of a metal containing copper, for example. In another example, the obverse-surface metal layers 27 may be made of aluminum, instead of copper. The obverse-surface metal layers 27 are covered by the resin member 7. The obverse-surface metal layers 27 include conductor layers 271A, 271B and 271C, a pair of gate layers 272A and 272B, a pair of sensor layers 273A and 273B, a pair of source signal layers 274A and 274B, and a plurality of dummy layers 275. The obverse-surface metal layers 27 are spaced apart from each other.

The conductor layer 271A is provided for mounting and supporting the semiconductor chips 10A thereon. The input terminal 41 (the pad portion 411) is bonded to the conductor layer 271A.

The conductor layer 271B is provided for bonding the second leads 52 (the second bonding portions 522) thereto. The input terminal 42 (the pad portion 421) is also bonded to the conductor layer 271B.

The conductor layer 271C is provided for mounting and supporting the semiconductor chips 10B thereon. The first leads 51 (the second bonding portions 512) are bonded to the conductor layer 271C. The output terminal 43 (the pad portion 431) is also bonded to the conductor layer 271C.

The pair of gate layers 272A and 272B corresponds to the pair of gate layers 24A and 24B. The gate layer 272A is electrically connected to the second electrode layers 122 (the gate electrodes) of the semiconductor chips 10A via wires 6 (gate wires 61). The gate layer 272B is electrically connected to the second electrode layers 122 (the gate electrodes) of the semiconductor chips 10B via the wires 6 (the gate wires 61). Each of the gate layers 272A and 272B has a strip portion extending in the x direction. The gate wires 61 are bonded to the strip portion. The gate terminal 44A (the pad portions 441) is directly bonded to the gate layer 272A. The gate terminal 44B (the pad portions 441) is directly bonded to the gate layer 272B.

The pair of sensor layers 273A and 273B corresponds to the pair of sensor layers 25A and 25B. The sensor layer 273A is electrically connected to the first electrode layers 121 (the source electrodes) of the semiconductor chips 10A via wires 6 (sensor wires 62). The sensor layer 273B is electrically connected to the first electrode layers 121 (the source electrodes) of the semiconductor chips 10B via the wires 6 (the sensor wires 62). Each of the sensor layers 25A and 25B has a strip portion extending in the x direction. The sensor wires 62 are bonded to the strip portion. The sensor terminal 45A (the pad portions 451) is directly bonded to the sensor layer 273A. The sensor terminal 45B (the pad portions 451) is directly bonded to the sensor layer 273B.

The pair of the source signal layers 274A and 274B are electrically connected to the first electrode layers 121 of the semiconductor chips 10. Specifically, the source signal layer 274A is electrically connected to the first electrode layers 121 (the source electrodes) of the semiconductor chips 10A via wires (source signal wires 65 described later). The source signal layer 274B is electrically connected to the first electrode layers 121 (the source electrodes) of the semiconductor chips 10B via wires 6 (source signal wires 65 described later). The source signal terminal 48A (the pad portions 481) is directly bonded to the source signal layer 274A. The source signal terminal 48B (the pad portions 481) is directly bonded to the source signal layer 274B.

The dummy layers 275 are not electrically connected to any of the semiconductor chips 10. Each dummy terminal 46 (the pad portion 461) is directly bonded to one of the dummy layer 275.

The reverse-surface metal layer 28 is formed on the reverse surface 262 of the insulating substrate 26. The reverse-surface metal layer 28 is made of the same material as the obverse-surface metal layers 27. The reverse-surface metal layer 28 may have a surface facing in the z1 direction exposed from the resin member 7. In another example, the surface of the reverse-surface metal layer 28 facing in the z1 direction may be covered by the resin member 7.

As shown in FIG. 18, the input terminal 41 is bonded to the conductor layer 271A at the pad portion 411. In the example shown in FIG. 18, the input terminal 41 has a band within the resin member 7. The conductor layer 271A is electrically connected the third electrode layers 123 of the semiconductor chips 10A. That is, the input terminal 41 is electrically connected to the third electrode layers 123 of the semiconductor chips 10A.

As shown in FIG. 18, the input terminal 42 is bonded to the conductor layer 271B at the pad portion 421. In the example shown in FIG. 18, the input terminal 42 has a bend within the resin member 7. The conductor layer 271B is electrically connected to the first electrode layers 121 of the semiconductor chips 10B via the second leads 52. That is, the input terminal 42 is electrically connected to the first electrode layers 121 of the semiconductor chips 10B.

As shown in FIG. 18, the output terminal 43 is bonded to the conductor layer 271C at the pad portion 431. In the example shown in FIG. 18, the output terminal 43 has a bend within the resin member 7. The conductor layer 271C is electrically connected to the first electrode layers 121 of the semiconductor chips 10A via the first leads 51, and also to the third electrode layers 123 of the semiconductor chips 10B. That is, the output terminal 43 is electrically connected to the first electrode layers 121 of the semiconductor chips 10A and also to the third electrode layers 123 of the semiconductor chips 10B.

The gate terminal 44A is bonded at its pad portion 441 to the gate layer 272A. The gate layer 272A is electrically connected to the second electrode layers 122 of the semiconductor chips 10A via gate wires 61. That is, the gate terminal 44A is electrically connected to the second electrode layers 122 of the semiconductor chips 10A. The gate terminal 44B is bonded at its pad portion 441 to the gate layer 272B. The gate layer 272B is electrically connected to the second electrode layers 122 of the semiconductor chips 10B via gate wires 61. That is, the gate terminal 44B is electrically connected to the second electrode layers 122 of the semiconductor chips 10B. As shown in FIG. 19, the gate terminals 44A and 44B are disposed symmetrical with respect to the center of the insulating substrate 26 in plan view.

The sensor terminal 45A is bonded at its pad portion 451 to the sensor layer 273A. The sensor layer 273A is electrically connected to the first electrode layers 121 of the semiconductor chips 10A via sensor wires 62. That is, the sensor terminal 45A is electrically connected the first electrode layers 121 of the semiconductor chips 10A. The sensor terminal 45B is bonded at its pad portion 451 to the sensor layer 273B. The sensor layer 273B is electrically connected to the first electrode layers 121 of the semiconductor chips 10B via sensor wires 62. That is, the sensor terminal 45B is electrically connected the first electrode layers 121 of the semiconductor chips 10B. As shown in FIG. 19, the sensor terminals 45A and 45B are disposed symmetrical with respect to the center of the insulating substrate 26 in plan view.

Each dummy terminal 46 is bonded at is pad portion 461 to one of the dummy layers 275. Since the dummy layers 275 are not electrically connected to any of the semiconductor chips 10A and 10B. That is, the dummy terminals 46 are electrically isolated from the semiconductor chips 10A and 10B.

Each of the source signal terminals 48A and 48B includes a pad portion 481 and a terminal portion 482. The pad portions 481 of the source signal terminals 48A and 48B are covered by the resin member 7. The terminal portions 482 connected from the respective pad portions 481 are exposed from the resin member 7.

The source signal terminal 48A is bonded at its pad portion 481 to the source signal layer 274A. The source signal layer 274A is electrically connected to the first electrode layers 121 of the semiconductor chips 10A via wires 6 (source signal wires 65 described later). That is, the source signal terminal 48A is electrically connected the first electrode layers 121 of the semiconductor chips 10A. The source signal terminal 48B is bonded at its pad portion 481 to the source signal layer 274B. The source signal layer 274B is electrically connected to the first electrode layers 121 of the semiconductor chips 10B via wires 6 (source signal wires 65 described later). That is, the source signal terminal 48B is electrically connected the first electrode layers 121 of the semiconductor chips 10B. As shown in FIG. 19, the source signal terminals 48A and 48B are disposed symmetrical with respect to the center of the insulating substrate 26 in plan view.

Among the plurality of terminals 40, the gate terminal 44A, the sensor terminal 45A, a subset of the dummy terminals 46, and the source signal terminal 48A protrude from the resin side surface 734. These terminals overlap with each other as viewed in the x direction, and each of these terminals has a bend that is covered by the resin member 7 and another a bend that is exposed from the resin member 7. The gate terminal 44B, the sensor terminal 45B, some of the dummy terminals 46, and the source signal terminal 48B protrude from the resin side surface 733.

These terminals overlap with each other as viewed in the x direction, and each of these terminals a bend that is covered by the resin member 7 and another bend that is exposed from the resin member 7. The configurations of the gate terminals 44A and 44B, the sensor terminals 45A and 45B, the dummy terminals 46, and the source signal terminals 48A and 48B are not specifically limited. For example, each of these terminals may protrude from the resin obverse surface 71.

As shown in FIGS. 18, 19 and 21, the first leads 51 connect the semiconductor chips 10A to the conductor layer 271C. The first leads 51 are bonded to the metal plates 31A at the first bonding portions 511. Also in this embodiment, each first bonding portion 511 is bonded to the metal plate 31A by laser welding and has a plurality of weld marks 8 in plan view. Similarly, the first leads 51 are bonded to the conductor layer 271C at the second bonding portions 512. Each second bonding portion 512 is bonded to the conductor layer 271C by laser welding and has a plurality of weld marks 8 in plan view as shown in FIGS. 18 and 19. The weld marks 8 are located in a matrix pattern in plan view.

In the present embodiment, a first lead 51 correspond to the "connecting member" recited in the claims. In this case, the semiconductor element 11 of a semiconductor chip 10A corresponds to the "semiconductor element" recited in the claims, a metal plate 31A to the "electrode member", the conductor layer 271A to the "first conductive member", and the conductor layer 271C to the "second conductive member".

As shown in FIGS. 18 and 21, the second leads 52 connect the semiconductor chips 10B to the conductor layer 271B. The second leads 52 are bonded to the metal plate 31B at the first bonding portions 521. Also in this embodiment, each first bonding portion 521 is bonded to the metal plate 31A by laser welding and has a plurality of weld marks 8 in plan view. Similarly, the second leads 52 are bonded to the conductor layer 271B at the second bonding portions 522. Each second bonding portion 522 is bonded to the conductor layer 271B by laser welding and has a plurality of weld marks 8 in plan view as shown in FIG. 18. The weld marks 8 are located in a matrix pattern in plan view.

Also in this embodiment, a second lead 52 corresponds to the "connecting member" recited in the claims. In this case, the semiconductor element 11 of a semiconductor chip 10B corresponds to the "semiconductor element" recited in the claims, a metal plate 31B to the "electrode member", the conductor layer 271C to the "first conductive member", and the conductor layer 271B to the "second conductive member".

The plurality of wires 6 of the semiconductor device A3 include a plurality of gate wires 61, a plurality of sensor wires 62 and a plurality of source signal wires 65.

Each gate wire 61 is bonded at one end to the second electrode layer 122 (the gate electrode) of a semiconductor chip 10 and at the other end to a corresponding one of the gate layers 272A and 272B. The gate wires 61 include those electrically connecting the second electrode layers 122 of the semiconductor chips 10A to the gate layer 272A and those electrically connecting the second electrode layers 122 of the semiconductor chips 10B to the gate layer 272B.

Each sensor wire 62 is bonded at one end to the first electrode layer 121 (the source electrode) of a semiconductor chip 10 and at the other end to a corresponding one of the sensor layers 273A and 273B. The sensor wires 62 include those electrically connecting the first electrode layers 121 (the source electrodes) of the semiconductor chips 10A to the sensor layer 273A and those electrically connecting the first electrode layers 121 (the source electrodes) of the semiconductor chips 10B to the sensor layer 273B.

Each source signal wire 65 is bonded at one end to the first electrode layer 121 (the source electrode) of one semiconductor chip out of the plurality of semiconductor chips 10A and 10B, and at the other end to a corresponding one of the source signal layers 274A and 274B. That is, one of the source signal wires 65 electrically connects the first electrode layer 121 (the source electrode) of one of the semiconductor chips 10A to the source signal layer 274A, while another of the source signal wires 65 electrically connects the first electrode layer 121 (the source electrode) of one of the semiconductor chips 10B to the source signal layer 274B.

Similarly to the semiconductor device A1, the semiconductor device A3 includes a lead member 5 bonded to a metal plate 31 by laser welding, providing electrical connection between the lead member 5 and the first region 111 of the semiconductor element 11. Consequently, like the semiconductor device A1, the semiconductor device A3 can prevent damage of the semiconductor element 11 and therefore helps to improve reliability.

The semiconductor device A3 is in part similar to the semiconductor device A1 in configuration and achieves the same advantages by such a part.

Fourth Embodiment

Figure 23:
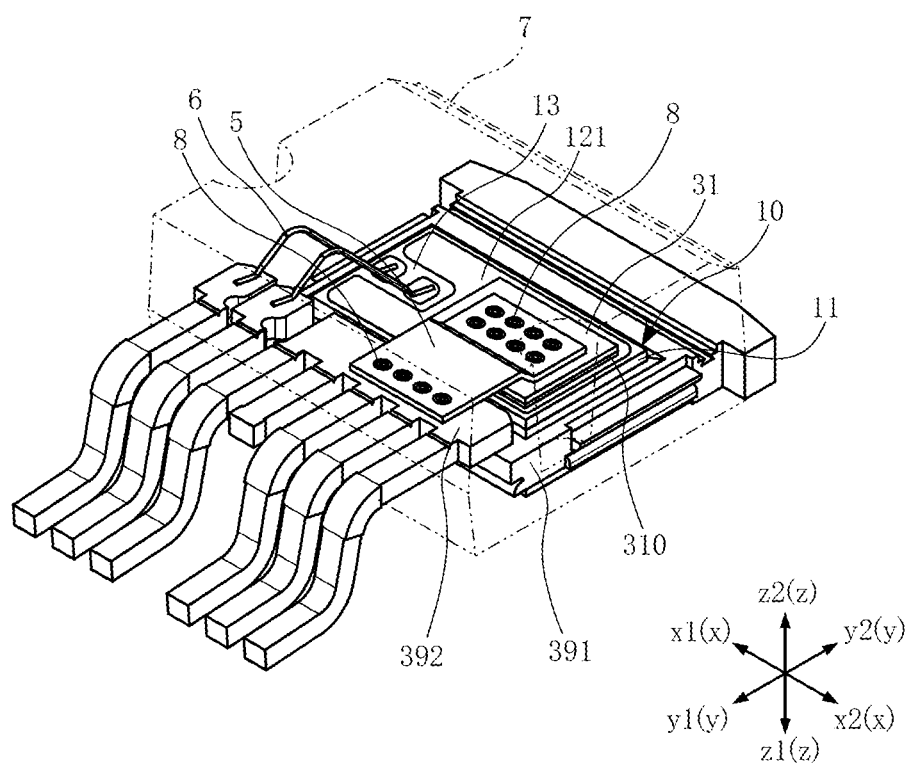
FIG. 23 is a perspective view of a semiconductor device according to a fourth embodiment.

FIG. 23 shows a semiconductor device according to a fourth embodiment. Unlike the semiconductor device A1, the semiconductor device A4 of the fourth embodiment is a discrete element including a single semiconductor chip 10. FIG. 23 is a perspective view of the semiconductor device A4, with the resin member 7 shown in phantom.

The semiconductor device A4 includes a semiconductor chip 10, a metal plate 31, a leadframe 39, a lead member 5, wires 6 and a resin member 7. The semiconductor device A4 is a leadframe-based package type.

The leadframe 39 supports the semiconductor chip 10 and is electrically connected to the semiconductor chip 10. The leadframe 39 has portions exposed from the resin member 7, and the exposed portions serving as terminals of the semiconductor device A4. The leadframe 39 includes a first part 391 and a second part 392.

The first part 391 supports the semiconductor chip 10. The first part 391 is bonded to the semiconductor chip 10 with the conductive bonding material 100. The first part 391 faces the element reverse surface 11b of the semiconductor element 11. The first part 391 is electrically connected to the third electrode layer 123 of the semiconductor chip 10. In the present embodiment, the first part 391 correspond to the "first conductive member" recited in the claims.

The second part 392 is spaced apart from the first part 391. A portion of the lead member 5 is bonded to the second part 392. The second part 392 and the lead member 5 are joined by laser welding using the laser emitting device LD. The resulting weld joint has a plurality of weld marks 8. In the present embodiment, the second part 392 correspond to the "second conductive member" recited in the claims.

Similarly to the semiconductor device A1, the semiconductor device A4 includes the lead member 5 bonded to the metal plate 31 by laser welding, providing electrical connection between the lead member 5 and the first region 111 of the semiconductor element 11. Consequently, like the semiconductor device A1, the semiconductor device A4 can prevent damage of the semiconductor element 11, and therefore helps to improve reliability.

Although the semiconductor device A4 in this embodiment is a discrete element, this is merely a non-limiting example. In another example, the semiconductor device A4 may be an IC such as LSI of a leadframe-based package. The leadframe 39 is not to limited to the configuration shown in in FIG. 23 and may be varied depending on well-known types of semiconductor packaging.

Fifth Embodiment

Figure 24:
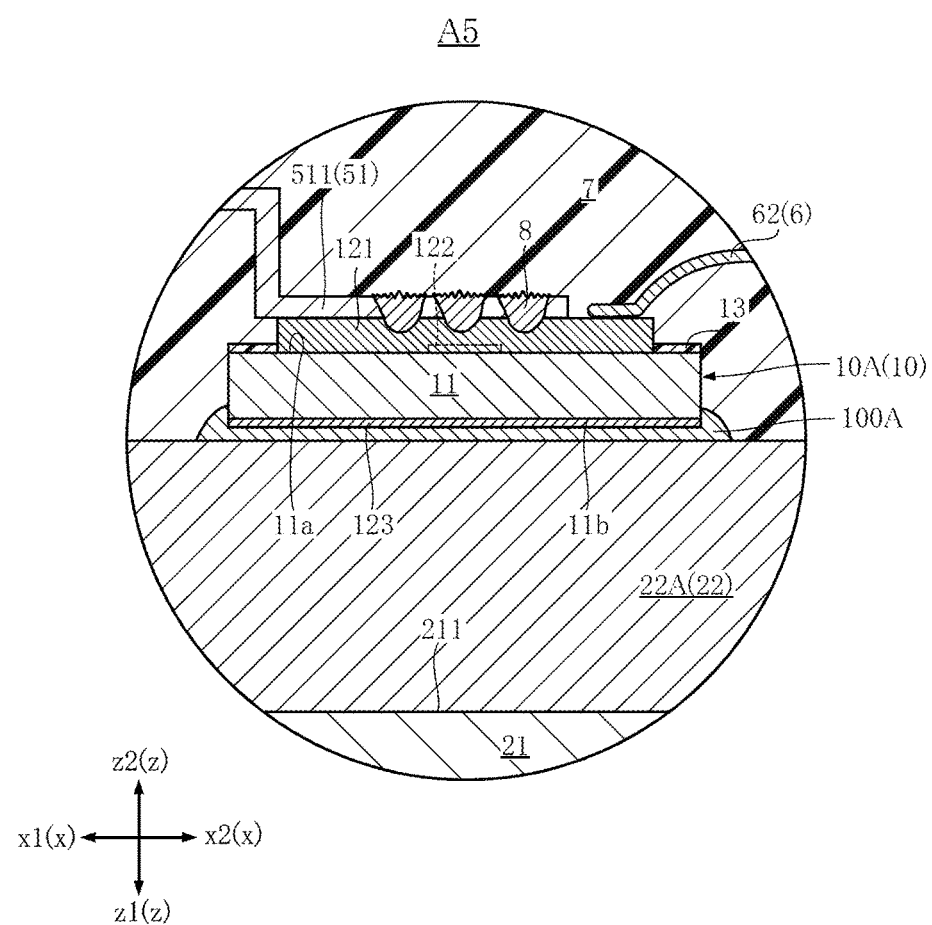
FIG. 24 is an enlarged view of a portion of a semiconductor device according to a fifth embodiment.

FIG. 24 shows a semiconductor device according to a fifth embodiment. Unlike the semiconductor device A1, the semiconductor device A5 of the fifth embodiment does not include any metal plate 31, and the lead members 5 are bonded directly to the first electrode layers 121. The lead members 5 and the first electrode layers 121 are bonded by laser welding. FIG. 24 is an enlarged sectional view showing an important part of the semiconductor device A1. FIG. 25 corresponds to FIG. 12 showing a portion of the semiconductor device A1 on an enlarged scale.

The first electrode layers 121 of the semiconductor device A5 are larger in z-direction dimension than the first electrode layers 121 of the semiconductor device A1. The first electrode layers 121 and the second electrode layers 122 are disposed in contact with the element obverse surface 11a, and the first electrode layers 121 are larger in z-direction dimension than the second electrode layers 122. The first electrode layers 121 protrude more than the second electrode layers 122 in the z direction. The first electrode layers 121 are smaller in z-direction dimension than the semiconductor element 11. The first electrode layers 121 may have a z-direction dimension of about 0.05 to 0.2 mm.

The semiconductor device A5 includes a semiconductor element 11, a first electrode layer 121 and a lead member 5. The semiconductor element 11 has a first region 111 (a source region, for example) formed on the element obverse surface 11a. The first electrode layer 121 is disposed on the element obverse surface 11a and electrically connected to the first region 111. The lead member 5 is bonded to the first electrode layer 121 by the laser welding process of the present disclosure. The lead member 5 is thus electrically connected to the first region 111 of the semiconductor element 11 via the first electrode layer 121. That it, by bonding the lead member 5 to the first electrode layer 121 by laser welding, the lead member 5 and the first region 111 of the semiconductor element 11 are electrically connected. In other words, the lead member 5 and the semiconductor element 11 (the first region 111) are electrically connected without having to perform ultrasonic bonding. Consequently, the semiconductor element 11 is not subjected to pressure and vibrations caused by ultrasonic bonding, preventing damage of the semiconductor element 11. The semiconductor device A5 therefore helps to improve reliability.

The semiconductor device A5 includes the first electrode layers 121 that protrude more than the second electrode layers 122 in the z direction. In this embodiment, the first electrode layers 121 are thicker than the second electrode layers 122. This allows the lead members 5 to be welded by laser to the first electrode layers 121 without damaging the semiconductor elements 11 by the heat of laser welding. Therefore, the semiconductor device A5 therefore helps to improve reliability.

Unlike the semiconductor device A1, the metal plates 31 are not used in the semiconductor device A5 of the fifth embodiment. Instead, the first electrode layers 121 of a greater thickness are used to enable laser welding for bonding the lead members 5 directly to the first electrode layers 121. The configuration of this embodiment may be combined with any of the second to fourth embodiments, i.e., with any of the semiconductor devices A2 to A4.

The semiconductor devices and the bonding methods according to the present disclosure are not limited to the embodiments described above. Various design changes can be made to the specific details of the elements of the semiconductor devices and the steps of the bonding methods according to the present disclosure.

The present disclosure include the semiconductor devices and the bonding methods according to the embodiments described in the following clauses.

[Clause 1]
A semiconductor device comprising:
a semiconductor element having an element obverse surface and an element reverse surface spaced apart from each other in a first direction and a first region formed on the element obverse surface;
an electrode member disposed on the element obverse surface and electrically connected to the first region;
a first conductive member disposed to face the element reverse surface and bonded to the semiconductor element;
a second conductive member spaced apart from the first conductive member; and
a connecting member electrically connecting the electrode member and the second conductive member,
wherein the connecting member is bonded to the electrode member by laser welding.

[Clause 2]
The semiconductor device according to Clause 1, wherein the electrode member comprises a first electrode layer forming an ohmic contact to the first region.

[Clause 3]
The semiconductor device according to Clause 2, further comprising a second electrode layer disposed on the element obverse surface, the second electrode layer being different from the first electrode layer,
wherein the semiconductor element further includes a second region formed on the element obverse surface,
the second electrode layer forms an ohmic contact to the second region, and
the first electrode layer protrudes more than the second electrode layer in the first direction.

[Clause 4]
The semiconductor device according to Clause 1, further comprising a first electrode layer forming an ohmic contact to the first region,
wherein the electrode member is a metal plate bonded to the first electrode layer via an electrically conductive bonding material.

[Clause 5]
The semiconductor device according to Clause 4, wherein the electrically conductive bonding material comprises a sintered metal.

[Clause 6]
The semiconductor device according to any one of Clauses 2 to 5, wherein the semiconductor element comprises a MOSFET.

[Clause 7]
The semiconductor device according to Clause 6, wherein the first region comprises a source region, and
the first electrode layer comprises a source electrode.

[Clause 8]
The semiconductor device according to any one of Clauses 1 to 7, wherein the connecting member includes a first bonding portion bonded to the electrode member, and
the first bonding portion has at least one weld mark that is circular as viewed in the first direction.

[Clause 9]
The semiconductor device according to Clause 8, wherein the at least one weld mark comprises a plurality of weld marks, and
the plurality of weld marks are arranged in a matrix pattern as viewed in the first direction.

[Clause 10]
The semiconductor device according to any one of Clauses 1 to 9, wherein the electrode member is smaller in dimension in the first direction than the semiconductor element.

[Clause 11]
The semiconductor device according to any one of Clauses 1 to 10, wherein the connecting member is made of a metal containing copper.

[Clause 12]
The semiconductor device according to any one of Clauses 1 to 11, further comprising an insulating member having an insulating-member obverse surface facing a same side as the element obverse surface, the insulating member supporting the first conductive member and the second conductive member on a side of the insulating-member obverse surface.

[Clause 13]
The semiconductor device according to any one of Clauses 1 to 12, further comprising a resin member covering the semiconductor element, the electrode member, the connecting member, the first conductive member and the second conductive member.

[Clause 14]
A method for bonding an electrically conductive connecting member to a semiconductor element having an element obverse surface and an element reverse surface spaced apart from each other in a first direction, the semiconductor element including a first region formed on the element obverse surface, the method comprising:
a first step of placing an electrically conductive member on the element obverse surface to electrically connect the electrically conductive member to the first region; and
a second step of placing the connecting member on the electrically conductive member and bonding the connecting member to the electrically conductive member by laser welding at a region where the connecting member and the electrically conductive member overlap as viewed in the first direction,
wherein the laser welding comprises using a first laser beam and a second laser beam having mutually different wavelengths.

[Clause 15]
The method according to Clause 14, wherein the wavelength of the first laser beam is longer than the wavelength of the second laser beam.

[Clause 16]
The method according to Clause 14 or 15, wherein an output power of the first laser beam is higher than an output power of the second laser beam.

[Clause 17]
The method according to any one of Clauses 14 to 16, wherein an irradiation time of the first laser beam is shorter than an irradiation time of the second laser beam.

[Clause 18]
The method according to any one of Clauses 14 to 17, wherein the laser welding includes outputting the second laser beam with a delay from outputting of the first laser beam.

[Clause 19]
The method according to Clause 18, wherein the laser welding includes starting the second laser beam to be outputted while the first laser beam is being outputted.

The invention claimed is:
1. A semiconductor device comprising:
a first semiconductor element having an element obverse surface and an element reverse surface spaced apart from each other in a first direction, a first region formed on the element obverse surface, and a first electrode layer disposed on the first region;

an electrode member disposed on the element obverse surface and electrically connected to the first electrode layer;

a first conductive member disposed to face the element reverse surface and bonded to the first semiconductor element;

a second conductive member spaced apart from the first conductive member; and a connecting member electrically connecting the electrode member and the second conductive member, wherein the connecting member is bonded to the electrode member by laser welding, and the connecting member includes a weld mark with a series of concentric crests and troughs in plan view.

2. The semiconductor device according to claim 1, wherein the first semiconductor element further includes a second region formed on the element obverse surface and a second electrode layer disposed on the second region, and the electrode member protrudes more than the second electrode layer in the first direction.

3. The semiconductor device according to claim 1, wherein the electrode member is a metal plate bonded to the first electrode layer via an electrically conductive bonding material.

4. The semiconductor device according to claim 3, wherein the electrically conductive bonding material comprises a sintered metal.

5. The semiconductor device according to claim 1, wherein the first semiconductor element comprises a MOSFET.

6. The semiconductor device according to claim 5, wherein the first region comprises a source region, and the first electrode layer comprises a source electrode.

7. The semiconductor device according to claim 1, wherein the connecting member includes a first bonding portion bonded to the electrode member, and the first bonding portion has at least one weld mark that is circular as viewed in the first direction.

8. The semiconductor device according to claim 7, wherein the at least one weld mark comprises a plurality of weld marks, and the plurality of weld marks are arranged in a matrix pattern as viewed in the first direction.

9. The semiconductor device according to claim 1, wherein the electrode member is smaller in dimension in the first direction than the first semiconductor element.

10. The semiconductor device according to claim 1, wherein the connecting member is made of a metal containing copper.

11. The semiconductor device according to claim 1, further comprising an insulating member having an insulating-member obverse surface facing a same side as the element obverse surface, the insulating member supporting the first conductive member and the second conductive member on a side of the insulating-member obverse surface.

12. The semiconductor device according to claim 1, further comprising a resin member covering the first semiconductor element, the electrode member, the connecting member, the first conductive member and the second conductive member.

13. A method for bonding an electrically conductive connecting member to a semiconductor element having an element obverse surface and an element reverse surface spaced apart from each other in a first direction, the semiconductor element including a first electrode layer disposed on a first region formed on the element obverse surface, the method comprising:

a first step of placing an electrically conductive member on the element obverse surface to electrically connect the electrically conductive member to the first electrode layer; and a second step of placing the connecting member on the electrically conductive member and bonding the connecting member to the electrically conductive member by laser welding at a region where the connecting member and the electrically conductive member overlap as viewed in the first direction, wherein the laser welding comprises using a first laser beam and a second laser beam having mutually different wavelengths to form a weld mark on the connecting member with a series of concentric crests and troughs in plan view.

14. The method according to claim 13, wherein the wavelength of the first laser beam is longer than the wavelength of the second laser beam.

15. The method according to claim 13, wherein an output power of the first laser beam is higher than an output power of the second laser beam.

16. The method according to claim 13, wherein an irradiation time of the first laser beam is shorter than an irradiation time of the second laser beam.

17. The method according to claim 13, wherein the laser welding includes outputting the second laser beam with a delay from outputting of the first laser beam.

18. The method according to claim 17, wherein the laser welding includes starting the second laser beam to be outputted while the first laser beam is being outputted.

19. The semiconductor device according to claim 1, wherein a center portion of the weld mark in plan view is formed with the crest.

20. The semiconductor device according to claim 1, further comprising a second semiconductor element, wherein the first semiconductor element forms an upper arm circuit and the second semiconductor element forms a lower arm circuit so as to configure a half-bridge switching circuit.

21. The semiconductor device according to claim 20, further comprising:

two input terminals to which a voltage is applied for the half-bridge switching circuit;

an insulating plate overlapping with a part of each of the two input terminals; and a resin member covering a part of each of the two input terminals and a part of the insulating plate, wherein the two input terminals each have a part protruding from the resin member so that the insulating plate is sandwiched between the parts.

22. The semiconductor device according to claim 1, wherein the first semiconductor element is made of a semiconductor material, which mainly is SiC.

23. The semiconductor device according to claim 1, further comprising:

an insulating layer bonded to a surface of the first conductive member facing the element reverse surface; and a wiring layer disposed on the insulating layer and electrically connected to the first semiconductor element.

* * * * *